United States Patent
Eroz et al.

(10) Patent No.: US 8,615,699 B2
(45) Date of Patent: *Dec. 24, 2013

(54) METHOD AND SYSTEM FOR ROUTING IN LOW DENSITY PARITY CHECK (LDPC) DECODERS

(71) Applicant: DTVG Licensing, Inc., El Segundo, CA (US)

(72) Inventors: Mustafa Eroz, Germantown, MD (US); Lin-Nan Lee, Potomac, MD (US); Feng-Wen Sun, Germantown, MD (US); Bob Cassagnol, Silver Spring, MD (US); Adam Von Ancken, New Market, MD (US)

(73) Assignee: DTVG Licensing, Inc., El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/626,803

(22) Filed: Sep. 25, 2012

(65) Prior Publication Data

US 2013/0091406 A1 Apr. 11, 2013

Related U.S. Application Data

(63) Continuation of application No. 13/153,076, filed on Jun. 3, 2011, now Pat. No. 8,291,293, which is a continuation of application No. 11/710,761, filed on Feb. 26, 2007, now Pat. No. 7,962,830, which is a continuation of application No. 10/613,824, filed on Jul. 3, 2003, now Pat. No. 7,203,887.

(60) Provisional application No. 60/393,457, filed on Jul. 3, 2002, provisional application No. 60/398,760, filed on Jul. 26, 2002, provisional application No. 60/403,812, filed on Aug. 15, 2002, provisional application No. 60/421,505, filed on Oct. 25, 2002, provisional application No. 60/421,999, filed on Oct. 29, 2002, provisional application No. 60/423,710, filed on Nov. 4, 2002, provisional application No. 60/440,199, filed on Jan. 15, 2003, provisional application No. 60/447,641, filed on Feb. 14, 2003, provisional application No. 60/456,220, filed on Mar. 20, 2003, provisional application No. 60/469,356, filed on May 9, 2003, provisional application No. 60/482,112, filed on Jun. 24, 2003, provisional application No. 60/482,107, filed on Jun. 24, 2003.

(51) Int. Cl.
*H03M 13/00* (2006.01)

(52) U.S. Cl.
USPC .......................................... 714/758; 714/774

(58) Field of Classification Search
USPC ............................................ 714/758, 774
See application file for complete search history.

(56) References Cited

U.S. PATENT DOCUMENTS

| | | | |
|---|---|---|---|
| 6,718,508 B2* | 4/2004 | Lodge et al. | 714/780 |
| 6,895,547 B2* | 5/2005 | Eleftheriou et al. | 714/801 |
| 6,961,888 B2* | 11/2005 | Jin et al. | 714/752 |
| 6,985,536 B2* | 1/2006 | Oelcer et al. | 375/261 |

OTHER PUBLICATIONS

Notice of Allowance dated Oct. 31, 2012 in U.S. Appl. No. 12/753,528, filed Apr. 2, 2010 by Mustafa Eroz et al.

* cited by examiner

*Primary Examiner* — M. Mujtaba Chaudry

(57) ABSTRACT

An approach is provided for decoding a low density parity check (LDPC) coded signal. Edge values associated with a structured parity check matrix used to generate the LDPC coded signal are retrieved from memory. The edge values specify the relationship of bit nodes and check nodes, and are stored within memory according to a predetermined scheme that permits concurrent retrieval of a set of the edge values. A decoded signal corresponding to the LDPC coded signal is output based on the retrieved edge values.

3 Claims, 16 Drawing Sheets

$$H = \begin{bmatrix} n_1 & n_2 & n_3 & n_4 & n_5 & n_6 & n_7 & n_8 \\ 1 & 0 & 0 & 1 & 1 & 0 & 0 & 1 \\ 0 & 1 & 1 & 0 & 0 & 1 & 0 & 0 \\ 1 & 0 & 1 & 0 & 0 & 1 & 1 & 1 \\ 0 & 1 & 0 & 1 & 0 & 0 & 1 & 0 \end{bmatrix} \begin{matrix} m_1 \\ m_2 \\ m_3 \\ m_4 \end{matrix}$$

$$B = \begin{bmatrix} 1 & & & & & & & 1 \\ x & 1 & & & 0 & & 1 & x \\ x & x & 1 & & & 1 & x & x \\ x & x & x & 1 & x & x & x & x \\ x & x & x & x & 1 & x & x & 1 \end{bmatrix}$$

FIG. 8A

010 $\circ$ $s_2$ $s_1 \circ$ 001
$s_0 \circ$ 000
$s_5 \circ$ 101
011 $\circ s_3$
110 $\circ s_6$ $\circ s_7$ $s_4 \circ$ 100
111

FIG. 8B

010 $\circ$ $s_5$ $s_4 \circ$ 001 $s_0 \circ$ 000
$s_1 \circ$ 101
011 $\circ s_7$
111 $\circ s_6$ 110 $\circ s_2$ $s_3 \circ$ 100

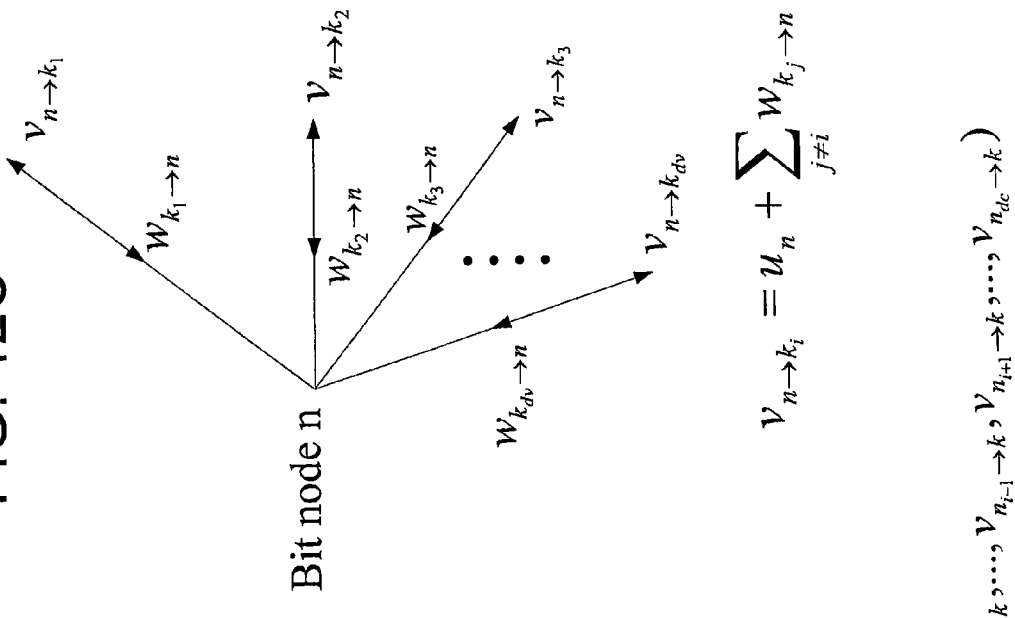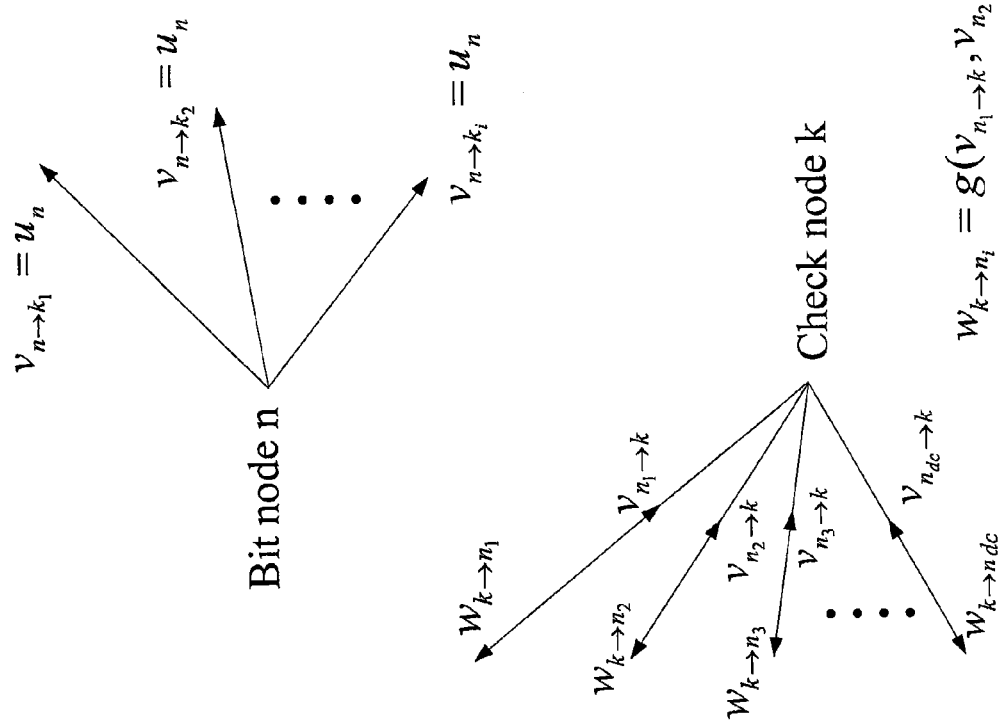

METHOD AND SYSTEM FOR ROUTING IN LOW DENSITY PARITY CHECK (LDPC) DECODERS

RELATED APPLICATIONS

This application is a continuation of U.S. patent application Ser. No. 13/153,076 filed Jun. 3, 2011, which is a continuation of U.S. patent application Ser. No. 11/710,761 filed Feb. 26, 2007, now U.S. Pat. No. 7,962,830, which is a continuation of U.S. patent application Ser. No. 10/613,824 filed Jul. 3, 2003, now U.S. Pat. No. 7,203,887, which is related to, and claims the benefit of the earlier filing date under 35 U.S.C. §119(e) of, U.S. Provisional Patent Application (Ser. No. 60/393,457) filed Jul. 3, 2002, entitled "Code Design and Implementation Improvements for Low Density Parity Check Codes," U.S. Provisional Patent Application (Ser. No. 60/398,760) filed Jul. 26, 2002, entitled "Code Design and Implementation Improvements for Low Density Parity Check Codes," U.S. Provisional Patent Application (Ser. No. 60/403,812) filed Aug. 15, 2002, entitled "Power and Bandwidth Efficient Modulation and Coding Scheme for Direct Broadcast Satellite and Broadcast Satellite Communications," U.S. Provisional Patent Application (Ser. No. 60/421,505), filed Oct. 25, 2002, entitled "Method and System for Generating Low Density Parity Check Codes," U.S. Provisional Patent Application (Ser. No. 60/421,999), filed Oct. 29, 2002, entitled "Satellite Communication System Utilizing Low Density Parity Check Codes," U.S. Provisional Patent Application (Ser. No. 60/423,710), filed Nov. 4, 2002, entitled "Code Design and Implementation Improvements for Low Density Parity Check Codes," U.S. Provisional Patent Application (Ser. No. 60/440,199) filed Jan. 15, 2003, entitled "Novel Solution to Routing Problem in Low Density Parity Check Decoders," U.S. Provisional Patent Application (Ser. No. 60/447,641) filed Feb. 14, 2003, entitled "Low Density Parity Check Code Encoder Design," U.S. Provisional Patent Application (Ser. No. 60/456,220) filed Mar. 20, 2003, entitled "Description LDPC and BCH Encoders," U.S. Provisional Patent Application (Ser. No. 60/469,356) filed May 9, 2003, entitled "Description LDPC and BCH Encoders," U.S. Provisional Patent Application (Ser. No. 60/482,112) filed Jun. 24, 2003, entitled "Description LDPC and BCH Encoders," and U.S. Provisional Patent Application (Ser. No. 60/482,107) filed Jun. 24, 2003, entitled "Description LDPC and BCH Encoders"; the entireties of which are incorporated herein by reference.

FIELD OF THE INVENTION

The present invention relates to communication systems, and more particularly to coded systems.

BACKGROUND OF THE INVENTION

Communication systems employ coding to ensure reliable communication across noisy communication channels. These communication channels exhibit a fixed capacity that can be expressed in terms of bits per symbol at certain signal to noise ratio (SNR), defining a theoretical upper limit (known as the Shannon limit). As a result, coding design has aimed to achieve rates approaching this Shannon limit. One such class of codes that approach the Shannon limit is Low Density Parity Check (LDPC) codes.

Traditionally, LDPC codes have not been widely deployed because of a number of drawbacks. One drawback is that the LDPC encoding technique is highly complex. Encoding an LDPC code using its generator matrix would require storing a very large, non-sparse matrix. Additionally, LDPC codes require large blocks to be effective; consequently, even though parity check matrices of LDPC codes are sparse, storing these matrices is problematic.

From an implementation perspective, a number of challenges are confronted. For example, storage is an important reason why LDPC codes have not become widespread in practice. Also, a key challenge in LDPC code implementation has been how to achieve the connection network between several processing engines (nodes) in the decoder. Further, the computational load in the decoding process, specifically the check node operations, poses a problem.

Therefore, there is a need for a LDPC communication system that employs simple encoding and decoding processes. There is also a need for using LDPC codes efficiently to support high data rates, without introducing greater complexity. There is also a need to improve performance of LDPC encoders and decoders. There is also a need to minimize storage requirements for implementing LDPC coding. There is a further need for a scheme that simplifies the communication between processing nodes in the LDPC decoder.

SUMMARY OF THE INVENTION

These and other needs are addressed by the present invention, wherein an approach for decoding a structured Low Density Parity Check (LDPC) codes is provided. Structure of the LDPC codes is provided by restricting portion part of the parity check matrix to be lower triangular and/or satisfying other requirements such that the communication between bit nodes and check nodes of the decoder is simplified. Edge values associated with the structured parity check matrix used to generate the LDPC coded signal are retrieved from memory. The edge values specify the relationship of bit nodes and check nodes, and according to one embodiment of the present invention, are stored within the memory according to a predetermined scheme (e.g., contiguous physical memory locations) that permits concurrent retrieval of a set of the edge values. According to another embodiment of the present invention, the edge values having bit nodes of n degrees are stored in a first portion of the memory, and edge values having bit nodes of greater than n degrees are stored in a second portion of the memory. The storage arrangement of the edge values advantageously allows fast retrieval of the edge values during the decoding process.

Also, the approach can advantageously exploit the unequal error protecting capability of LDPC codes on transmitted bits to provide extra error protection to more vulnerable bits of high order modulation constellations (such as 8-PSK (Phase Shift Keying)). The decoding process involves iteratively regenerating signal constellation bit metrics into an LDPC decoder after each decoder iteration or several decoder iterations. The above arrangement provides a computational efficient approach to decoding LDPC codes.

According to one aspect of an embodiment of the present invention, a method for decoding a low density parity check (LDPC) coded signal is disclosed. The method includes retrieving edge values associated with a structured parity check matrix used to generate the LDPC coded signal, wherein the edge values specify relationship of bit nodes and check nodes, and are stored according to a predetermined scheme that permits concurrent retrieval of a set of the edge values. The method also includes outputting a decoded signal corresponding to the LDPC coded signal based on the retrieved edge values.

According to another aspect of an embodiment of the present invention, a decoder for decoding a low density parity check (LDPC) coded signal is disclosed. The decoder includes means for retrieving edge values associated with a structured parity check matrix used to generate the LDPC coded signal. The decoder also includes memory for storing the edge values according to a predetermined scheme that permits concurrent retrieval of a set of the edge values, wherein the edge values specify relationship of bit nodes and check nodes. Further, the decoder includes means for outputting a decoded signal corresponding to the LDPC coded signal based on the retrieved edge values.

According to another aspect of an embodiment of the present invention, a memory accessible by a low density parity check (LDPC) decoder for decoding a LDPC coded signal is disclosed. The memory includes a first portion storing a first group of edge values associated with a structured parity check matrix used to generate the LDPC coded signal, the first group of edges being connected to bit nodes of n degrees. Additionally, the memory includes a second portion storing a second group of edge values associated with the structured parity check matrix used to generate the LDPC coded signal, the second group of edges being connected to bit nodes of greater than n degrees, wherein a set of edge values from the first group or the second group is retrieved to output a decoded signal.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 8A and 8B are, respectively, a diagram of a non-Gray 8-PSK modulation scheme, and a Gray 8-PSK modulation, each of which can be used in the system of FIG. 1;

FIGS. 12A-12C are diagrams of the interactions between the check nodes and the bit nodes in a decoding process, according to an embodiment of the present invention;

DESCRIPTION OF THE PREFERRED EMBODIMENT

A system, method, and software for efficiently decoding structured Low Density Parity Check (LDPC) codes are described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

Figure 1:
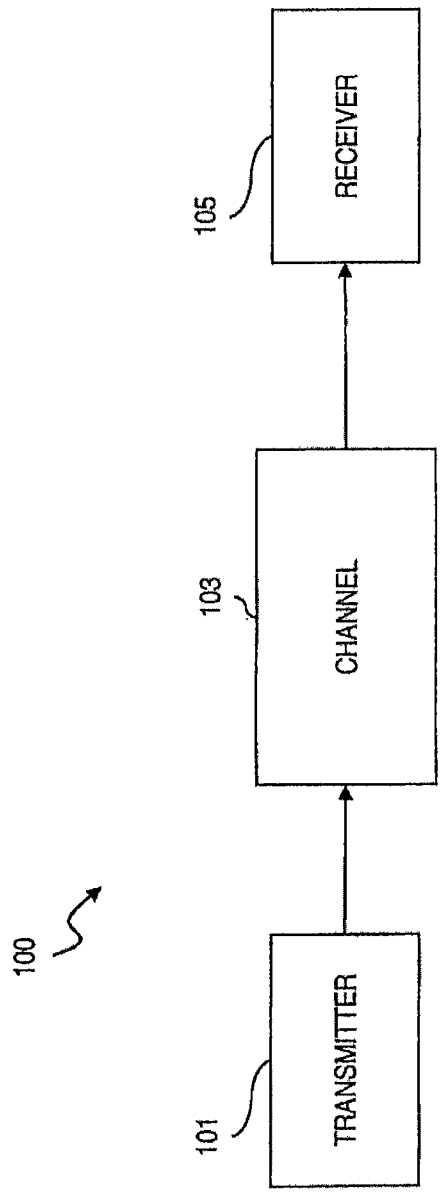
FIG. 1 is a diagram of a communications system configured to utilize Low Density Parity Check (LDPC) codes, according to an embodiment of the present invention.

FIG. 1 is a diagram of a communications system configured to utilize Low Density Parity Check (LDPC) codes, according to an embodiment of the present invention. A digital communications system 100 includes a transmitter 101 that generates signal waveforms across a communication channel 103 to a receiver 105. In this discrete communications system 100, the transmitter 101 has a message source that produces a discrete set of possible messages; each of the possible messages has a corresponding signal waveform. These signal waveforms are attenuated, or otherwise altered, by communications channel 103. To combat the noise channel 103, LDPC codes are utilized.

The LDPC codes that are generated by the transmitter 101 enables high speed implementation without incurring any performance loss. These structured LDPC codes output from the transmitter 101 avoid assignment of a small number of check nodes to the bit nodes already vulnerable to channel errors by virtue of the modulation scheme (e.g., 8-PSK).

Such LDPC codes have a parallelizable decoding algorithm (unlike turbo codes), which advantageously involves simple operations such as addition, comparison and table look-up. Moreover, carefully designed LDPC codes do not exhibit any sign of error floor.

According to one embodiment of the present invention, the transmitter 101 generates, using a relatively simple encoding technique, LDPC codes based on parity check matrices (which facilitate efficient memory access during decoding) to communicate with the receiver 105. The transmitter 101 employs LDPC codes that can outperform concatenated turbo+RS (Reed-Solomon) codes, provided the block length is sufficiently large.

Figure 2:
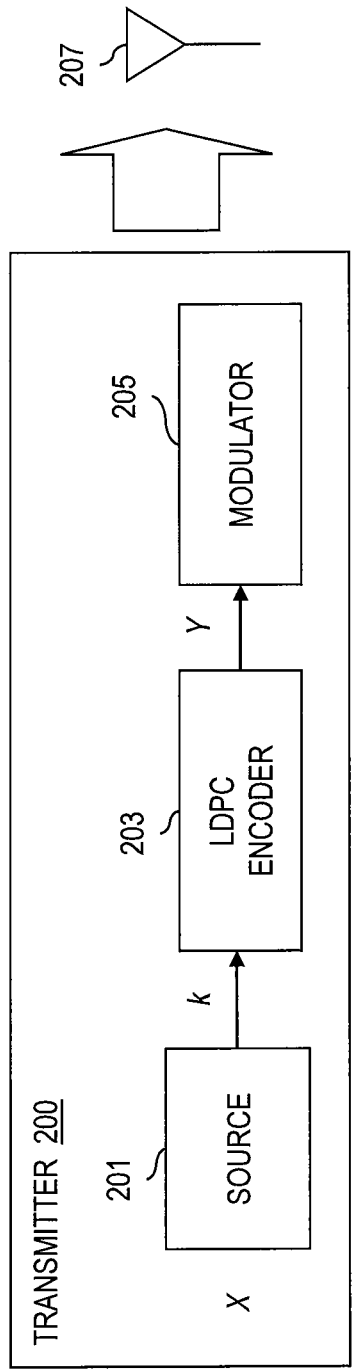
FIG. 2 is a diagram of an exemplary transmitter in the system of FIG. 1.

FIG. 2 is a diagram of an exemplary transmitter in the system of FIG. 1. A transmitter 200 is equipped with an LDPC encoder 203 that accepts input from an information source 201 and outputs coded stream of higher redundancy suitable for error correction processing at the receiver 105. The information source 201 generates k signals from a discrete alphabet, X LDPC codes are specified with parity check matrices. On the other hand, encoding LDPC codes require, in general, specifying the generator matrices. Even though it is possible to obtain generator matrices from parity check matrices using Gaussian elimination, the resulting matrix is no longer sparse and storing a large generator matrix can be complex.

Encoder 203 generates signals from alphabet Y to a modulator 205 using a simple encoding technique that makes use of only the parity check matrix by imposing structure onto the parity check matrix. Specifically, a restriction is placed on the parity check matrix by constraining certain portion of the matrix to be triangular. The construction of such a parity check matrix is described more fully below in FIG. 6. Such a restriction results in negligible performance loss, and therefore, constitutes an attractive trade-off.

Modulator 205 maps the encoded messages from encoder 203 to signal waveforms that are transmitted to a transmit antenna 207, which emits these waveforms over the communication channel 103. Accordingly, the encoded messages are modulated and distributed to a transmit antenna 207. The transmissions from the transmit antenna 207 propagate to a receiver, as discussed below.

Figure 3:
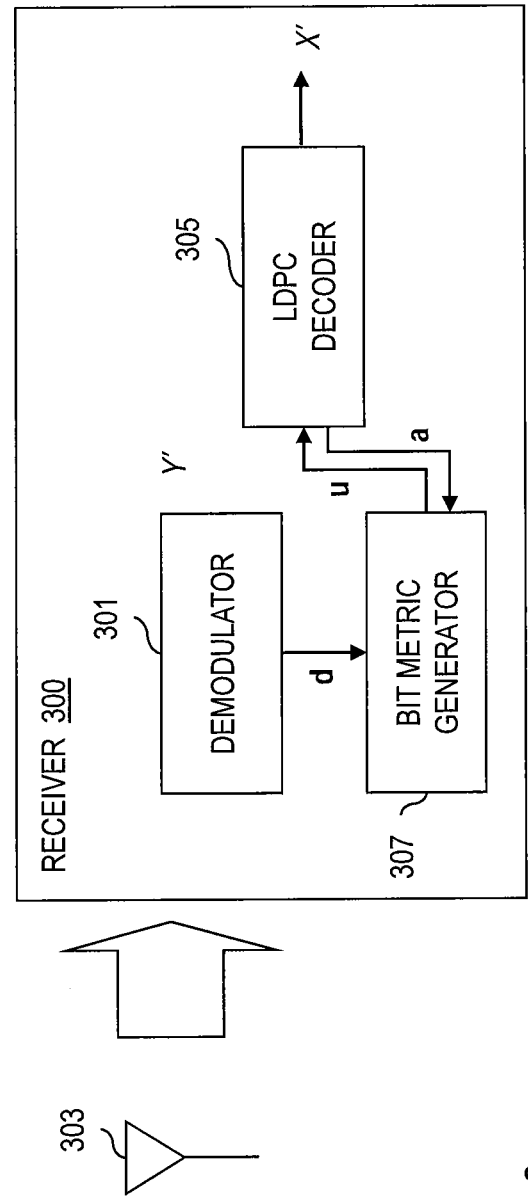
FIG. 3 is a diagram of an exemplary receiver in the system of FIG. 1.

FIG. 3 is a diagram of an exemplary receiver in the system of FIG. 1. At the receiving side, a receiver 300 includes a demodulator 301 that performs demodulation of received signals from transmitter 200. These signals are received at a receive antenna 303 for demodulation. After demodulation, the received signals are forwarded to a decoder 305, which attempts to reconstruct the original source messages by generating messages, X', in conjunction with a bit metric generator 307. With non-Gray mapping, the bit metric generator 307 exchanges probability information with the decoder 305 back and forth (iteratively) during the decoding process, which is detailed in FIG. 10. Alternatively, if Gray mapping is used (according to one embodiment of the present invention), one pass of the bit metric generator is sufficient, in which further attempts of bit metric generation after each LDPC decoder iteration are likely to yield limited performance improvement; this approach is more fully described with respect to FIG. 11. To appreciate the advantages offered by the present invention, it is instructive to examine how LDPC codes are generated, as discussed in FIG. 4.

Figures 4, 5, 6:
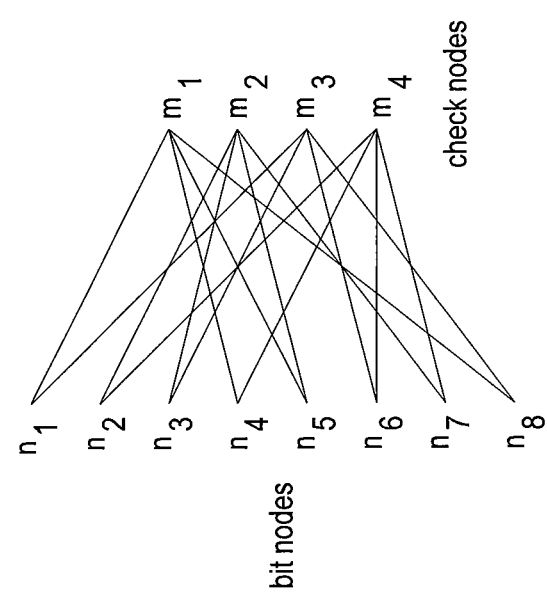
FIG. 4 is a diagram of a sparse parity check matrix, in accordance with an embodiment of the present invention.
FIG. 5 is a diagram of a bipartite graph of an LDPC code of the matrix of FIG. 4.
FIG. 6 is a diagram of a sub-matrix of a sparse parity check matrix, wherein the sub-matrix contains parity check values restricted to the lower triangular region, according to an embodiment of the present invention.

FIG. 4 is a diagram of a sparse parity check matrix, in accordance with an embodiment of the present invention. LDPC codes are long, linear block codes with sparse parity check matrix $H_{(n-k) \times n}$. Typically the block length, n, ranges from thousands to tens of thousands of bits. For example, a parity check matrix for an LDPC code of length n=8 and rate ½ is shown in FIG. 4. The same code can be equivalently represented by the bipartite graph, per FIG. 5.

FIG. 5 is a diagram of a bipartite graph of an LDPC code of the matrix of FIG. 4. Parity check equations imply that for each check node, the sum (over GF (Galois Field)(2)) of all adjacent bit nodes is equal to zero. As seen in the figure, bit nodes occupy the left side of the graph and are associated with one or more check nodes, according to a predetermined relationship. For example, corresponding to check node $m_1$, the following expression exists $n_1+n_4+n_5+n_8=0$ with respect to the bit nodes.

Returning the receiver 303, the LDPC decoder 305 is considered a message passing decoder, whereby the decoder 305 aims to find the values of bit nodes. To accomplish this task, bit nodes and check nodes iteratively communicate with each other. The nature of this communication is described below.

From check nodes to bit nodes, each check node provides to an adjacent bit node an estimate ("opinion") regarding the value of that bit node based on the information coming from other adjacent bit nodes. For instance, in the above example if the sum of $n_4$, $n_5$ and $n_8$ "looks like" 0 to $m_1$, then $m_1$ would indicate to $n_1$ that the value of $n_1$ is believed to be 0 (since $n_1+n_4+n_5+n_8=0$); otherwise $m_1$ indicate to $n_1$ that the value of $n_1$ is believed to be 1. Additionally, for soft decision decoding, a reliability measure is added.

From bit nodes to check nodes, each bit node relays to an adjacent check node an estimate about its own value based on the feedback coming from its other adjacent check nodes. In the above example $n_1$ has only two adjacent check nodes $m_1$ and $m_3$. If the feedback coming from $m_3$ to $n_1$ indicates that the value of $n_1$ is probably 0, then $n_1$ would notify $m_1$ that an estimate of $n_1$'s own value is 0. For the case in which the bit node has more than two adjacent check nodes, the bit node performs a majority vote (soft decision) on the feedback coming from its other adjacent check nodes before reporting that decision to the check node it communicates. The above process is repeated until all bit nodes are considered to be correct (i.e., all parity check equations are satisfied) or until a predetermined maximum number of iterations is reached, whereby a decoding failure is declared.

FIG. 6 is a diagram of a sub-matrix of a sparse parity check matrix, wherein the sub-matrix contains parity check values restricted to the lower triangular region, according to an embodiment of the present invention. As described previously, the encoder 203 (of FIG. 2) can employ a simple encoding technique by restricting the values of the lower triangular area of the parity check matrix. According to an embodiment of the present invention, the restriction imposed on the parity check matrix is of the form:

$$H_{(n-k) \times n} = [A_{(n-k) \times k} B_{(n-k) \times (n-k)}]$$

where B is lower triangular.

Any information block $i=(i_0, i_1, \ldots, i_{k-1})$ encoded to a codeword $c=(i_0, i_1, \ldots, i_{k-1}, p_0, p_1, \ldots p_{n-k-1})$ using $Hc^T=0$, and recursively solving for parity bits; for example, $$a_{00}i_0+a_{01}i_1+\ldots+a_{0,k-1}i_{k-1}+p_0=0 \Rightarrow \text{Solve } p_0$$

$$a_{10}i_0+a_{11}i_1+\ldots+a_{1,k-1}i_{k-1}+b_{10}p_0+p_1=0 \Rightarrow \text{Solve } p_1$$

and similarly for $p_2, p_3, \ldots, p_{n-k-1}$.

Figure 7:
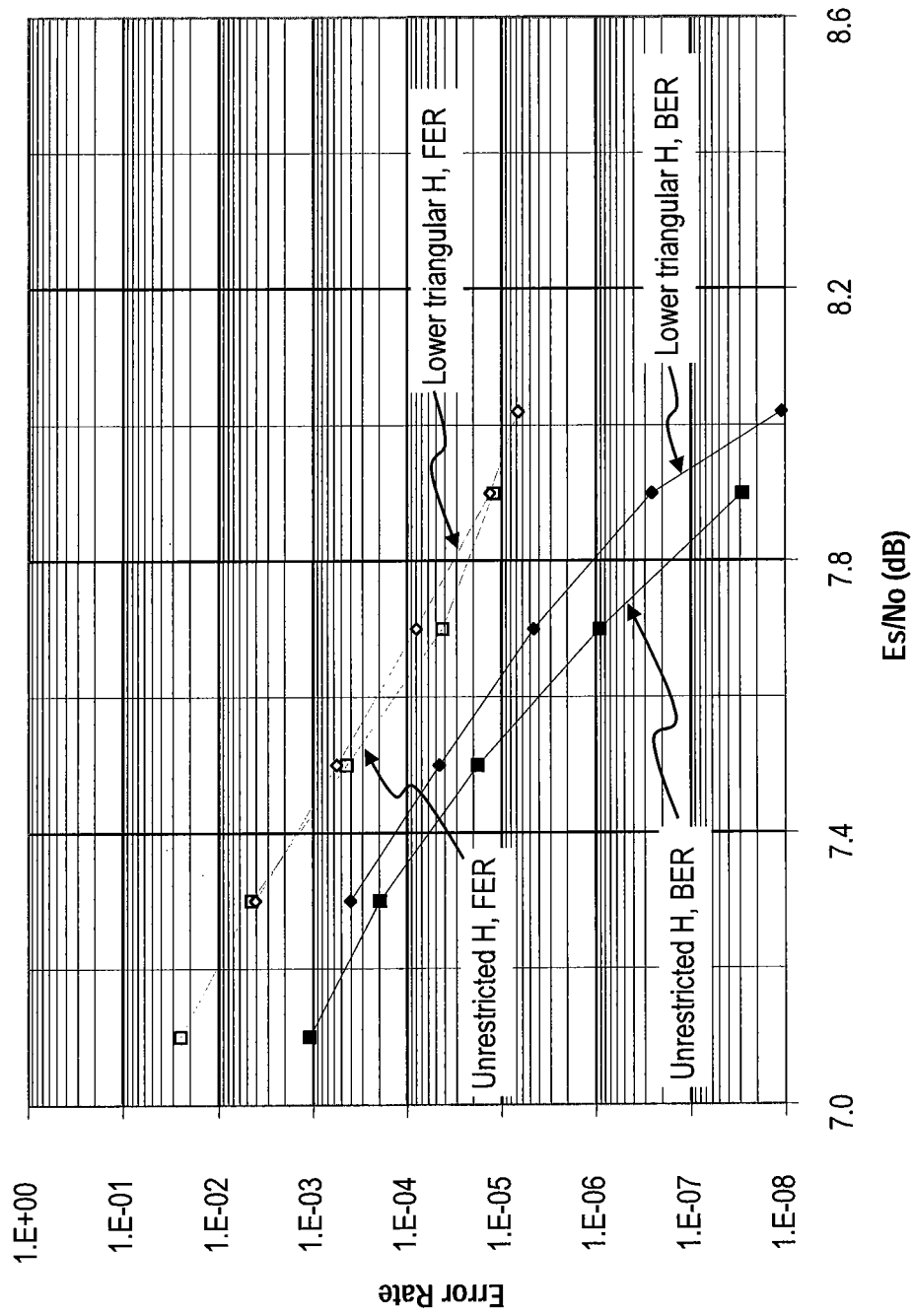
FIG. 7 is a graph showing performance between codes utilizing unrestricted parity check matrix (H matrix) versus restricted H matrix having a sub-matrix as in FIG. 6.

FIG. 7 is a graph showing performance between codes utilizing unrestricted parity check matrix (H matrix) versus restricted H matrix of FIG. 6. The graph shows the performance comparison between two LDPC codes: one with a general parity check matrix and the other with a parity check matrix restricted to be lower triangular to simplify encoding. The modulation scheme, for this simulation, is 8-PSK. The performance loss is within 0.1 dB. Therefore, the performance loss is negligible based on the restriction of the lower triangular H matrices, while the gain in simplicity of the encoding technique is significant. Accordingly, any parity check matrix that is equivalent to a lower triangular or upper triangular under row and/or column permutation can be utilized for the same purpose.

FIGS. 8A and 8B are, respectively, a diagram of a non-Gray 8-PSK modulation scheme, and a Gray 8-PSK modulation, each of which can be used in the system of FIG. 1. The non-Gray 8-PSK scheme of FIG. 8A can be utilized in the receiver of FIG. 3 to provide a system that requires very low Frame Erasure Rate (FER). This requirement can also be satisfied by using a Gray 8-PSK scheme, as shown in FIG. 8B, in conjunction with an outer code, such as Bose, Chaudhuri, and Hocquenghem (BCH), Hamming, or Reed-Solomon (RS) code.

Under this scheme, there is no need to iterate between the LDPC decoder 305 (FIG. 3) and the bit metric generator 307, which may employ 8-PSK modulation. In the absence of an outer code, the LDPC decoder 305 using Gray labeling exhibit an earlier error floor, as shown in FIG. 9 below.

Figure 9:
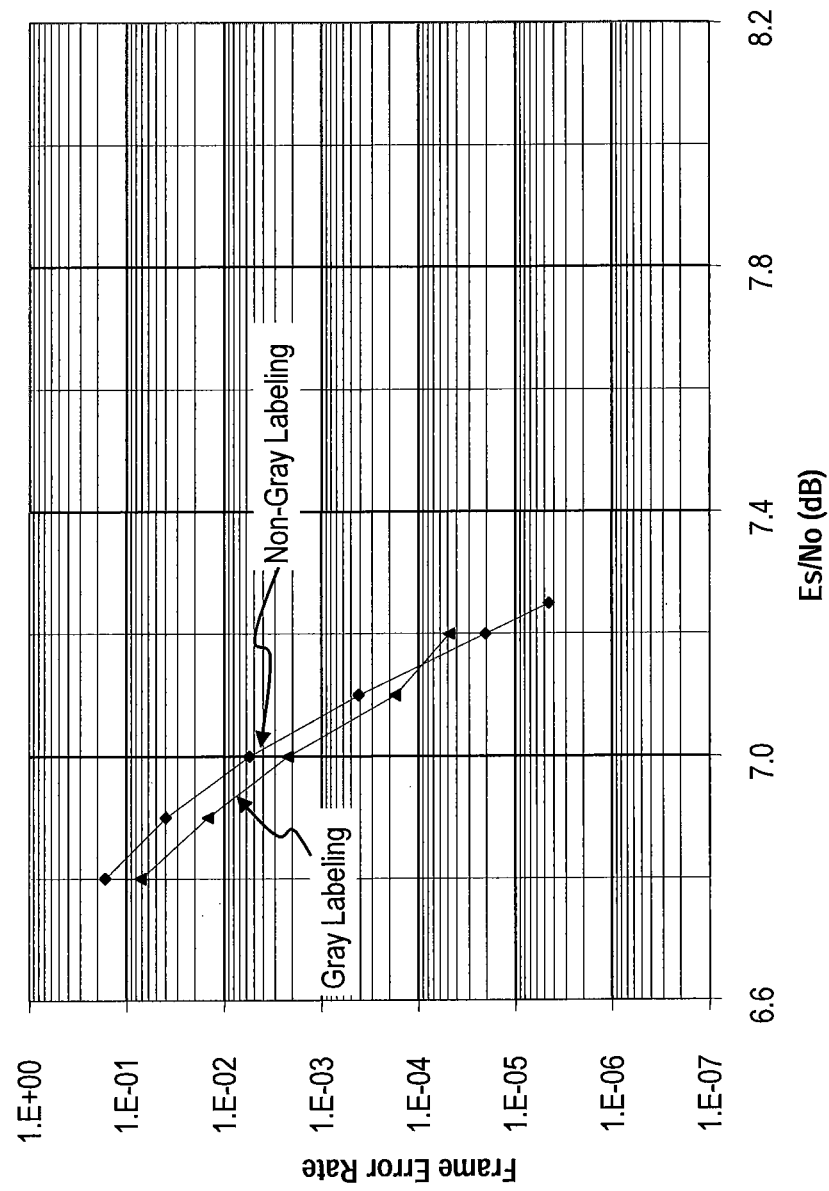
FIG. 9 is a graph showing performance between codes utilizing Gray labeling versus non-Gray labeling.

FIG. 9 is a graph showing performance between codes utilizing Gray labeling versus non-Gray labeling of FIGS. 8A and 8B. The error floor stems from the fact that assuming correct feedback from LDPC decoder 305, regeneration of 8-PSK bit metrics is more accurate with non-Gray labeling since the two 8-PSK symbols with known two bits are further apart with non-Gray labeling. This can be equivalently seen as operating at higher Signal-to-Noise Ratio (SNR). Therefore, even though error asymptotes of the same LDPC code using Gray or non-Gray labeling have the same slope (i.e., parallel to each other), the one with non-Gray labeling passes through lower FER at any SNR.

On the other hand, for systems that do not require very low FER, Gray labeling without any iteration between LDPC decoder 305 and 8-PSK bit metric generator 307 may be more suitable because re-generating 8-PSK bit metrics before every LDPC decoder iteration causes additional complexity. Moreover, when Gray labeling is used, re-generating 8-PSK bit metrics before every LDPC decoder iteration yields only very slight performance improvement. As mentioned previously, Gray labeling without iteration may be used for systems that require very low FER, provided an outer code is implemented.

The choice between Gray labeling and non-Gray labeling depends also on the characteristics of the LDPC code. Typically, the higher bit or check node degrees, the better it is for Gray labeling, because for higher node degrees, the initial feedback from LDPC decoder 305 to 8-PSK (or similar higher order modulation) bit metric generator 307 deteriorates more with non-Gray labeling.

When 8-PSK (or similar higher order) modulation is utilized with a binary decoder, it is recognized that the three (or more) bits of a symbol are not received "equally noisy". For example with Gray 8-PSK labeling, the third bit of a symbol is considered more noisy to the decoder than the other two bits. Therefore, the LDPC code design does not assign a small number of edges to those bit nodes represented by "more noisy" third bits of 8-PSK symbol so that those bits are not penalized twice.

Figure 10:
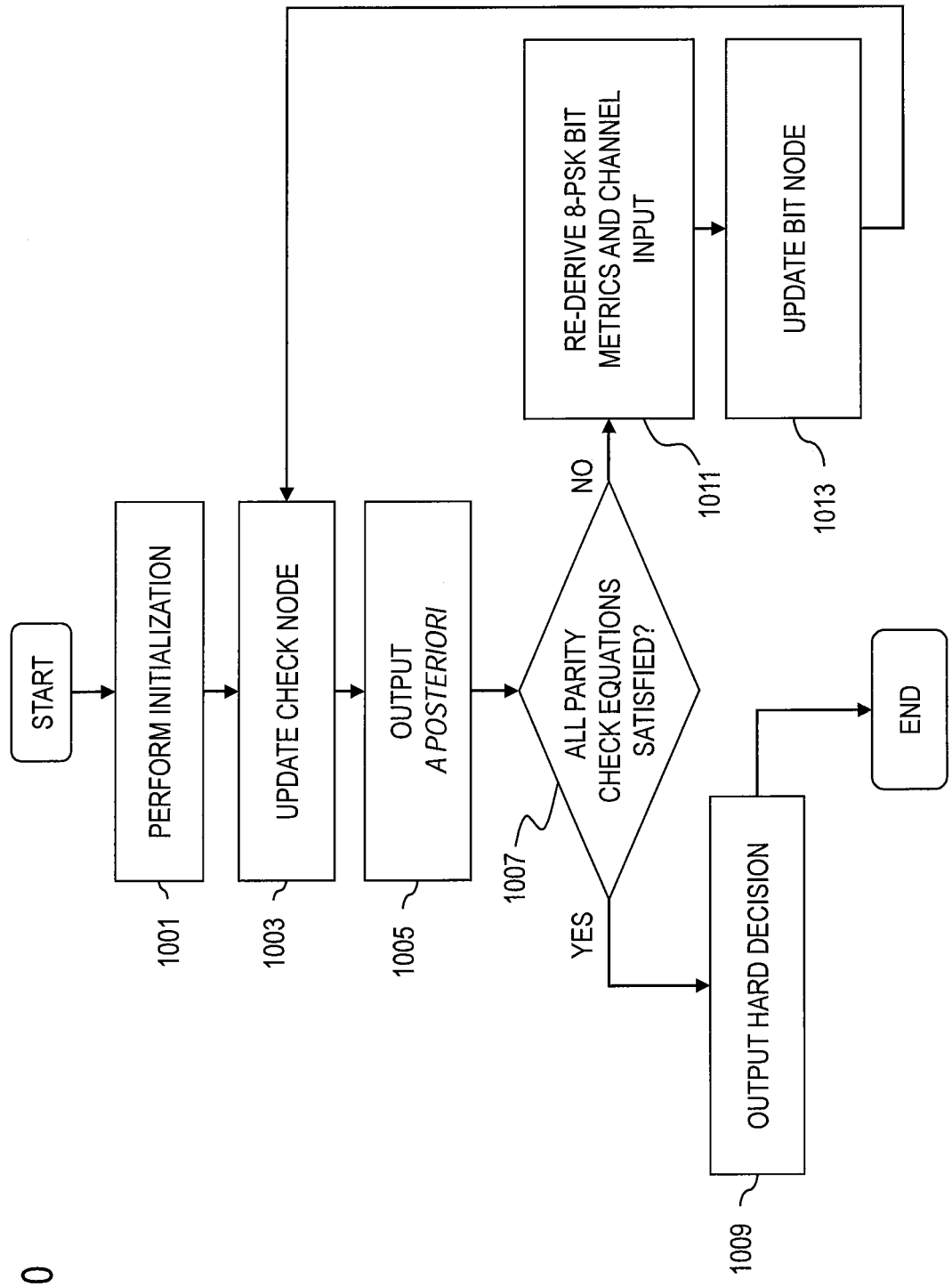
FIG. 10 is a flow chart of the operation of the LDPC decoder using non-Gray mapping, according to an embodiment of the present invention.

FIG. 10 is a flow chart of the operation of the LDPC decoder using non-Gray mapping, according to an embodiment of the present invention. Under this approach, the LDPC decoder and bit metric generator iterate one after the other. In this example, 8-PSK modulation is utilized; however, the same principles apply to other higher modulation schemes as well. Under this scenario, it is assumed that the demodulator 301 outputs a distance vector, d, denoting the distances between received noisy symbol points and 8-PSK symbol points to the bit metric generator 307, whereby the vector components are as follows:

$$d_i = -\frac{E_s}{N_0}\{(r_x - s_{i,x})^2 + (r_y - s_{i,y})^2\}$$

$$i = 0, 1, \ldots, 7.$$

The 8-PSK bit metric generator 307 communicates with the LDPC decoder 305 to exchange a priori probability information and a posteriori probability information, which respectively are represented as u, and a. That is, the vectors u and a respectively represent a priori and a posteriori probabilities of log likelihood ratios of coded bits.

The 8-PSK bit metric generator 307 generates the a priori likelihood ratios for each group of three bits as follows. First, extrinsic information on coded bits is obtained:

$$e_j = a_j - u_j, j = 0, 1, 2.$$

Next, 8-PSK symbol probabilities, $p_i$ $i=0, 1, \ldots, 7$, are determined.

$$*y_j = -f(0, e_j) j = 0, 1, 2 \text{ where } f(a,b) = \max(a,b) + \text{LUT}_f(a, b) \text{ with } \text{LUT}_f(a,b) = \ln(1 + e^{-|a-b|})$$

$$*x_j = y_j + e_j, j = 0, 1, 2$$

$$*p_0 = x_0 + x_1 + x_2 \, p_4 = y_0 + x_1 + x_2$$

$$p_1 = x_0 + x_1 + y_2 \, p_5 = y_0 + x_1 + y_2$$

$$p_2 = x_0 + y_1 + x_2 \, p_6 = y_0 + y_1 + x_2$$

$$p_3 = x_0 + y_1 + y_2 \, p_7 = y_0 + y_1 + y_2$$

Next, the bit metric generator 307 determines a priori log likelihood ratios of the coded bits as input to LDPC decoder 305, as follows:

$$u_0 = f(d_0 + p_0, d_1 + p_1, d_2 + p_2 d_3 + p_3) - f(d_4 + p_4, d_5 + p_5, d_6 + p_6, d_7 + p_7) - e_0$$

$$u_1 = f(d_0 + p_0, d_1 + p_1, d_4 + p_4 d_5 + p_5) - f(d_2 + p_2, d_3 + p_3, d_6 + p_6, d_7 + p_7) - e_1$$

$$u_2 = f(d_0 + p_0, d_2 + p_2, d_4 + p_4 d_6 + p_6) - f(d_1 + p_1, d_3 + p_3, d_5 + p_5, d_7 + p_7) - e_2$$

It is noted that the function $f(.)$ with more than two variables can be evaluated recursively; e.g. $f(a, b, c) = f(f(a, b), c)$.

The operation of the LDPC decoder 305 utilizing non-Gray mapping is now described. In step 1001, the LDPC decoder 305 initializes log likelihood ratios of coded bits, v, before the first iteration according to the following (and as shown in FIG. 12A):

$$v_{n \to k_i} = u_n, n = 0, 1, \ldots, N-1, i = 1, 2, \ldots, \deg(\text{bit node } n)$$

Here, $v_{n \to k_i}$ denotes the message that goes from bit node n to its adjacent check node $k_i$, $u_n$ denotes the demodulator output for the bit n and N is the codeword size.

In step 1003, a check node, k, is updated, whereby the input v yields the output w. As seen in FIG. 12B, the incoming messages to the check node k from its $d_d$ adjacent bit nodes are denoted by $v_{n_1 \to k}, v_{n_2 \to k}, \ldots, v_{n_{dc} \to k}$. The goal is to compute the outgoing messages from the check node k back to $d_c$ adjacent bit nodes. These messages are denoted by $w_{k \to n_1}, w_{k \to n_2}, \ldots, w_{k \to n_{dc}}$, where $$w_{k \to n_i} = g(v_{n_1 \to k}, v_{n_2 \to k}, \ldots, v_{n_{i-1} \to k}, v_{n_{i+1} \to k}, \ldots, v_{n_{dc} \to k}).$$

The function $g(\ )$ is defined as follows:

$$g(a,b) = \text{sign}(a) \times \text{sign}(b) \times \{\min(|a|,|b|)\} + \text{LUT}_g(a,b),$$

where $LUT_g(a, b) = \ln(1+e^{-|a+b|}) - \ln(1+e^{-|a-b|})$. Similar to function $f$, function $g$ with more than two variables can be evaluated recursively.

Next, the decoder 305, per step 1205, outputs a posteriori probability information (FIG. 12C), such that:

$$a_n = u_n + \sum_j w_{k_j \to n}.$$

Per step 1007, it is determined whether all the parity check equations are satisfied. If these parity check equations are not satisfied, then the decoder 305, as in step 1009, re-derives 8-PSK bit metrics and channel input $u_n$. Next, the bit node is updated, as in step 1011. As shown in FIG. 14C, the incoming messages to the bit node n from its $d_v$ adjacent check nodes are denoted by $w_{k_1 \to n}, w_{k_2 \to n}, \ldots, w_{k_{d_v} \to n}$. The outgoing messages from the bit node n are computed back to $d_v$ adjacent check nodes; such messages are denoted by $v_{n \to k_1}, v_{n \to k_2}, \ldots, v_{n \to k_{d_v}}$, and computed as follows:

$$v_{n \to k_i} = u_n + \sum_{j \neq i} w_{k_j \to n}$$

In step 1013, the decoder 305 outputs the hard decision (in the case that all parity check equations are satisfied):

$$\hat{c}_n = \begin{cases} 0, & a_n \geq 0 \\ 1, & a_n < 0 \end{cases}$$

Stop if $H\hat{c}^T = 0$

The above approach is appropriate when non-Gray labeling is utilized. However, when Gray labeling is implemented, the process of FIG. 11 is executed.

Figure 11:
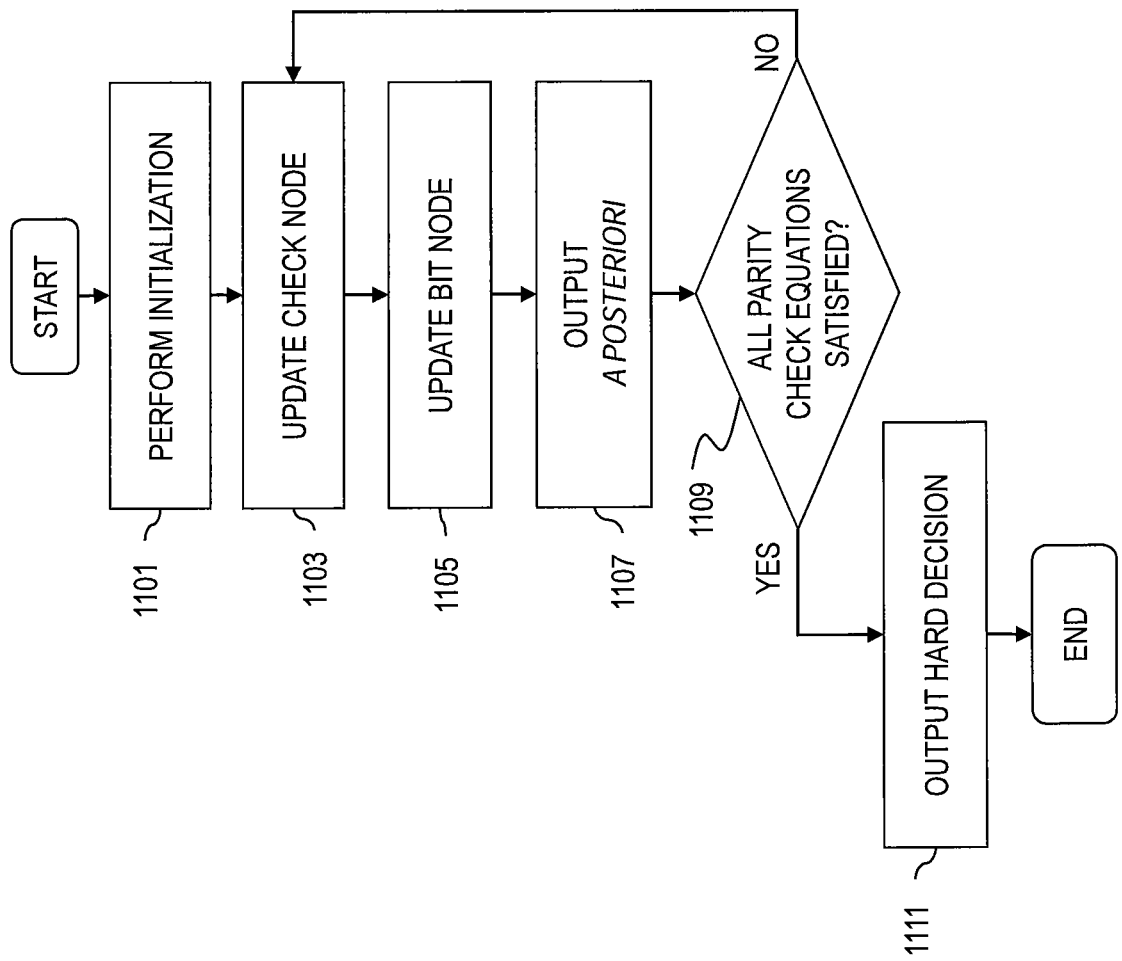
FIG. 11 is a flow chart of the operation of the LDPC decoder of FIG. 3 using Gray mapping, according to an embodiment of the present invention.

FIG. 11 is a flow chart of the operation of the LDPC decoder of FIG. 3 using Gray mapping, according to an embodiment of the present invention. When Gray labeling is used, bit metrics are advantageously generated only once before the LDPC decoder, as re-generating bit metrics after every LDPC decoder iteration may yield nominal performance improvement. As with steps 1001 and 1003 of FIG. 10, initialization of the log likelihood ratios of coded bits, v, are performed, and the check node is updated, per steps 1101 and 1103. Next, the bit node n is updated, as in step 1105. Thereafter, the decoder outputs the a posteriori probability information (step 1107). In step 1109, a determination is made whether all of the parity check equations are satisfied; if so, the decoder outputs the hard decision (step 1111). Otherwise, steps 1103-1107 are repeated.

Figure 13B:
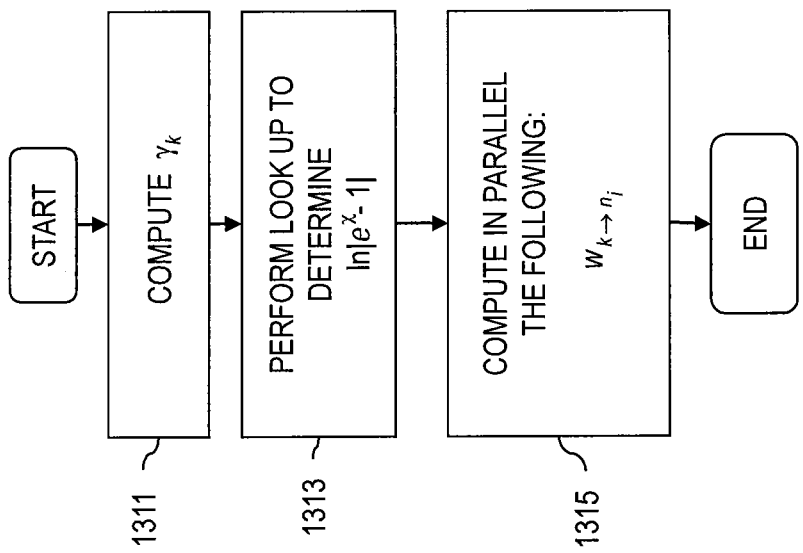
FIGS. 13A and 13B are flowcharts of processes for computing outgoing messages between the check nodes and the bit nodes using, respectively, a forward-backward approach and a parallel approach, according to various embodiments of the present invention.
Figure 13A:
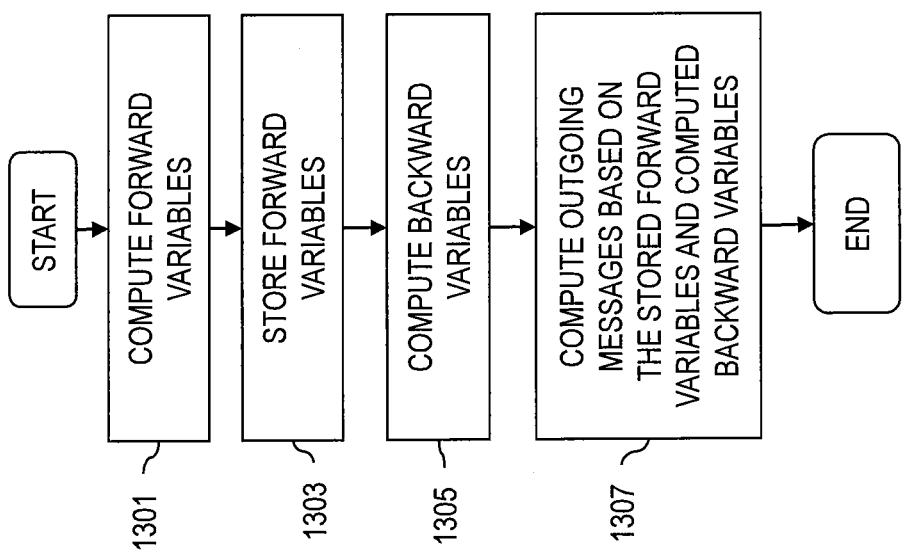

FIG. 13A is a flowchart of process for computing outgoing messages between the check nodes and the bit nodes using a forward-backward approach, according to an embodiment of the present invention. For a check node with $d_c$ adjacent edges, the computation of $d_c(d_c-1)$ and numerous $g(.,.)$ functions are performed. However, the forward-backward approach reduces the complexity of the computation to $3(d_c-2)$, in which $d_c-1$ variables are stored.

Referring to FIG. 12B, the incoming messages to the check node k from adjacent bit nodes are denoted by $v_{n_1 \to k}, v_{n_2 \to k}, \ldots, v_{n_{d_c} \to k}$. It is desired that the outgoing messages are computed from the check node k back to $d_c$ adjacent bit nodes; these outgoing messages are denoted by $w_{k \to n_1}, w_{k \to n_2}, \ldots, w_{k \to n_{d_c}}$.

Under the forward-backward approach to computing these outgoing messages, forward variables, $f_1, f_2, \ldots, f_{d_c}$, are defined as follows:

$$f_1 = v_{1 \to k}$$

$$f_2 = g(f_1, v_{2 \to k})$$

$$f_3 = g(f_2, v_{3 \to k})$$

$$\vdots$$

$$f_{d_c} = g(f_{d_c-1}, v_{d_c \to k})$$

In step 1301, these forward variables are computed, and stored, per step 1303.

Similarly, backward variables, $b_1, b_2, \ldots, b_{d_c}$, are defined by the following:

$$b_{d_c} = v_{d_c \to k}$$

$$b_{d_c-1} = g(b_{d_c}, v_{d_c-1 \to k})$$

$$\vdots$$

$$b_1 = g(b_2, v_{1 \to k})$$

In step 1305, these backward variables are then computed. Thereafter, the outgoing messages are computed, as in step 1307, based on the stored forward variables and the computed backward variables. The outgoing messages are computed as follows:

$$w_{k \to 1} = b_2$$

$$w_{k \to i} = g(f_{i-1}, b_{i+1}) \quad i=2, 3, \ldots, d_c-1$$

$$w_{k \to d_c} = f_{d_c-1}$$

Under this approach, only the forward variables, $f_2, f_3, \ldots, f_{d_c}$, are required to be stored. As the backward variables $b_i$ are computed, the outgoing messages, $w_{k \to i}$, are simultaneously computed, thereby negating the need for storage of the backward variables.

The computation load can be further enhance by a parallel approach, as next discussed.

FIG. 13B is a flowchart of process for computing outgoing messages between the check nodes and the bit nodes using a parallel approach, according to an embodiment of the present invention. For a check node k with inputs $v_{n_1 \to k}, v_{n_2 \to k}, \ldots, v_{n_{d_c} \to k}$ from $d_c$ adjacent bit nodes, the following parameter is computed, as in step 1311:

$$\gamma_k = g(v_{n_1 \to k}, v_{n_2 \to k}, \ldots, v_{n_{d_c} \to k}).$$

It is noted that the $g(.,.)$ function can also be expressed as follows:

$$g(a, b) = \ln \frac{1 + e^{a+b}}{e^a + e^b}.$$

Exploiting the recursive nature of the $g(.,.)$ function, the following expression results:

$$\gamma_k = \ln \frac{1 + e^{g(v_{n_1 \to k}, \ldots, v_{n_{i-1} \to k}, v_{n_{i+1} \to k}, \ldots, v_{n_{d_c} \to k}) + v_{n_i \to k}}}{e^{g(v_{n_1 \to k}, \ldots, v_{n_{i-1} \to k}, v_{n_{i+1} \to k}, \ldots, v_{n_{d_c} \to k})} + e^{v_{n_i \to k}}} = \ln \frac{1 + e^{w_{k \to n_i} + v_{n_i \to k}}}{e^{w_{k \to n_i}} + e^{v_{n_i \to k}}}$$

Accordingly, $w_{k \to n_i}$ can be solved in the following manner:

$$w_{k \to n_i} = \ln \frac{e^{v_{n_i \to k} + \gamma_k} - 1}{e^{v_{n_i \to k} - \gamma_k} - 1} - \gamma_k$$

The ln(.) term of the above equation can be obtained using a look-up table $LUT_x$ that represents the function $\ln|e^x - 1|$ (step 1313). Unlike the other look-up tables $LUT_f$ or $LUT_g$, the table $LUT_x$ would likely requires as many entries as the number of quantization levels. Once $\gamma_k$ is obtained, the calculation of $w_{k \to n_i}$ for all $n_i$ can occur in parallel using the above equation, per step 1315.

The computational latency of $\gamma_k$ is advantageously $\log_2(d_c)$.

Figure 14A:
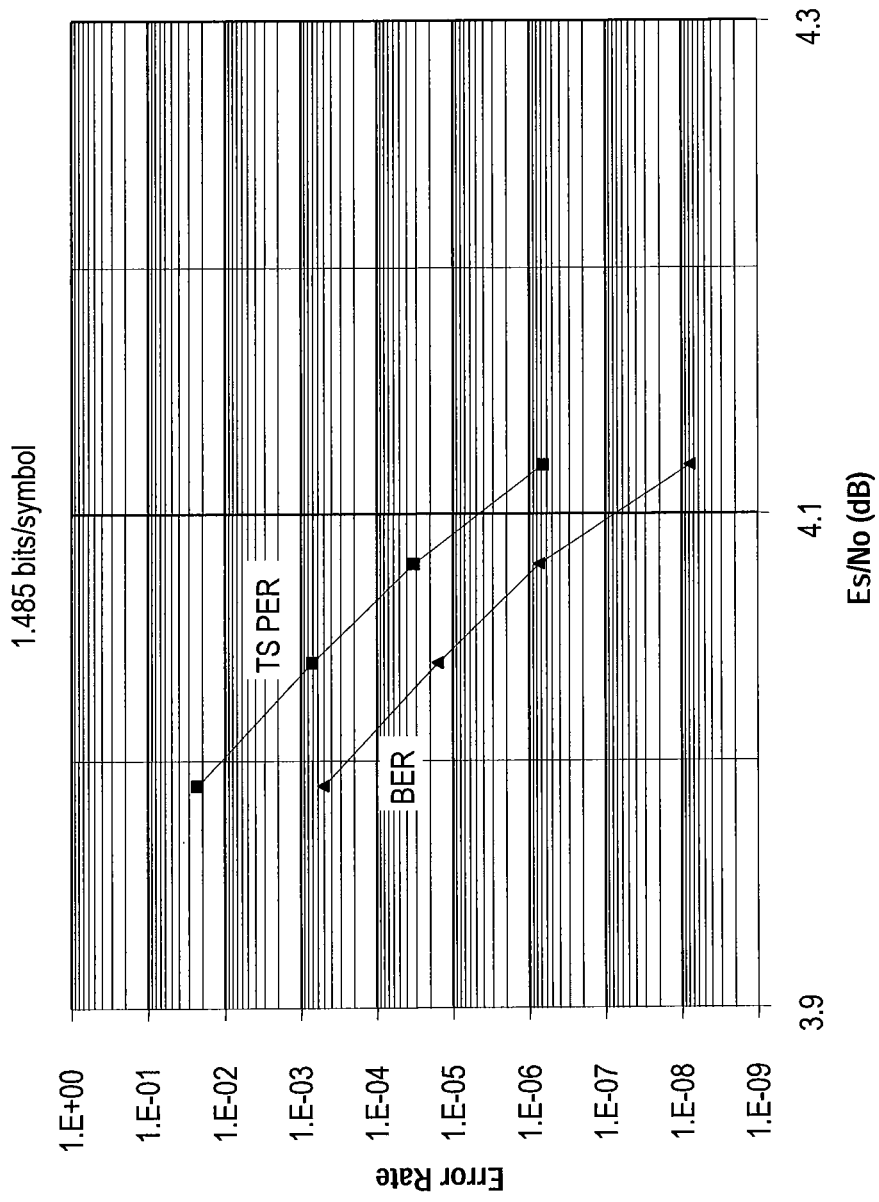
FIGS. 14A-14C are graphs showing simulation results of LDPC codes generated in accordance with various embodiments of the present invention.
Figure 14B:
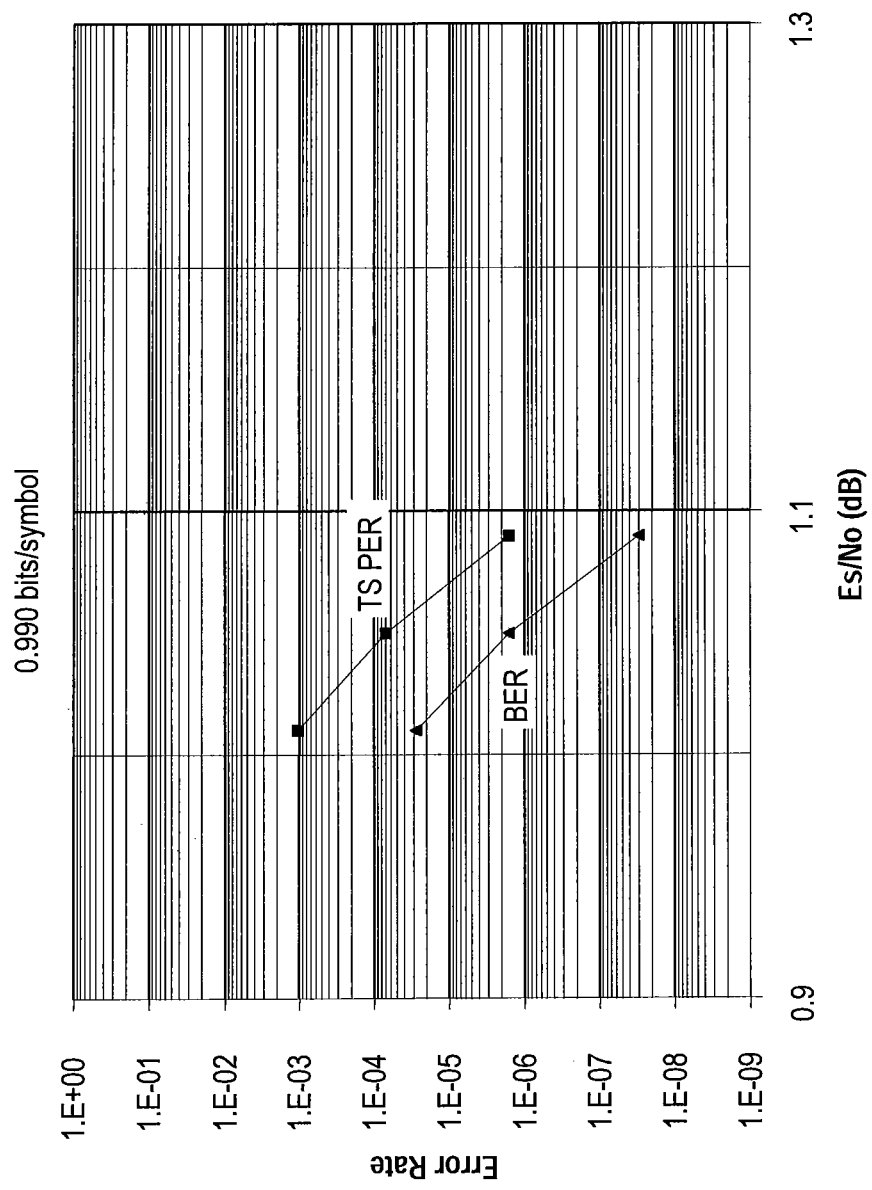
Figure 14C:
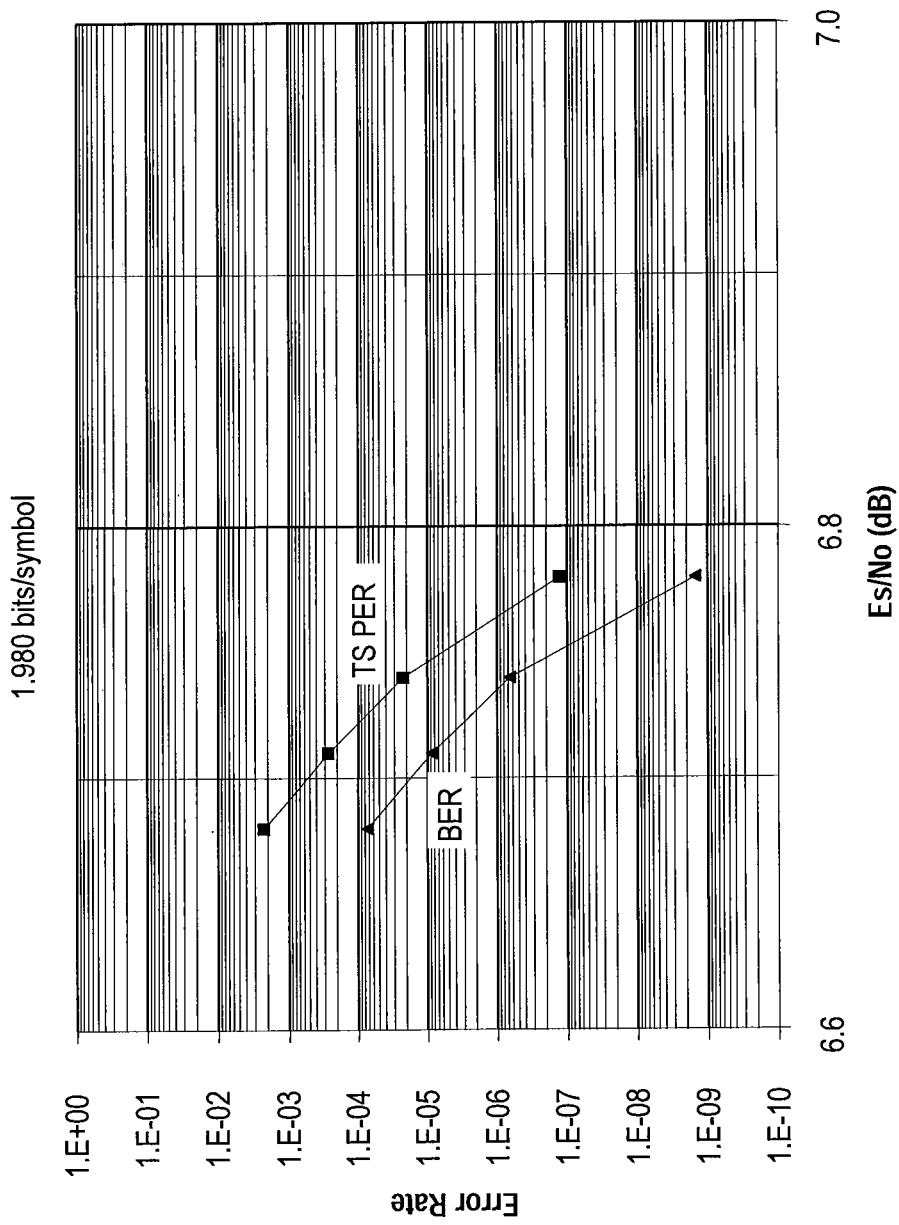

FIGS. 14A-14C are graphs showing simulation results of LDPC codes generated in accordance with various embodiments of the present invention. In particular, FIGS. 14A-14C show the performance of LDPC codes with higher order modulation and code rates of 3/4 (QPSK, 1.485 bits/symbol), 2/3 (8-PSK, 1.980 bits/symbol), and 5/6 (8-PSK, 2.474 bits/symbol).

Two general approaches exist to realize the interconnections between check nodes and bit nodes: (1) a fully parallel approach, and (2) a partially parallel approach. In fully parallel architecture, all of the nodes and their interconnections are physically implemented. The advantage of this architecture is speed.

The fully parallel architecture, however, may involve greater complexity in realizing all of the nodes and their connections. Therefore with fully parallel architecture, a smaller block size may be required to reduce the complexity. In that case, for the same clock frequency, a proportional reduction in throughput and some degradation in FER versus Es/No performance may result.

The second approach to implementing LDPC codes is to physically realize only a subset of the total number of the nodes and use only these limited number of "physical" nodes to process all of the "functional" nodes of the code. Even though the LDPC decoder operations can be made extremely simple and can be performed in parallel, the further challenge in the design is how the communication is established between "randomly" distributed bit nodes and check nodes. The decoder 305 (of FIG. 3), according to one embodiment of the present invention, addresses this problem by accessing memory in a structured way, as to realize a seemingly random code. This approach is explained with respect to FIGS. 15A and 15B.

Figure 15A:
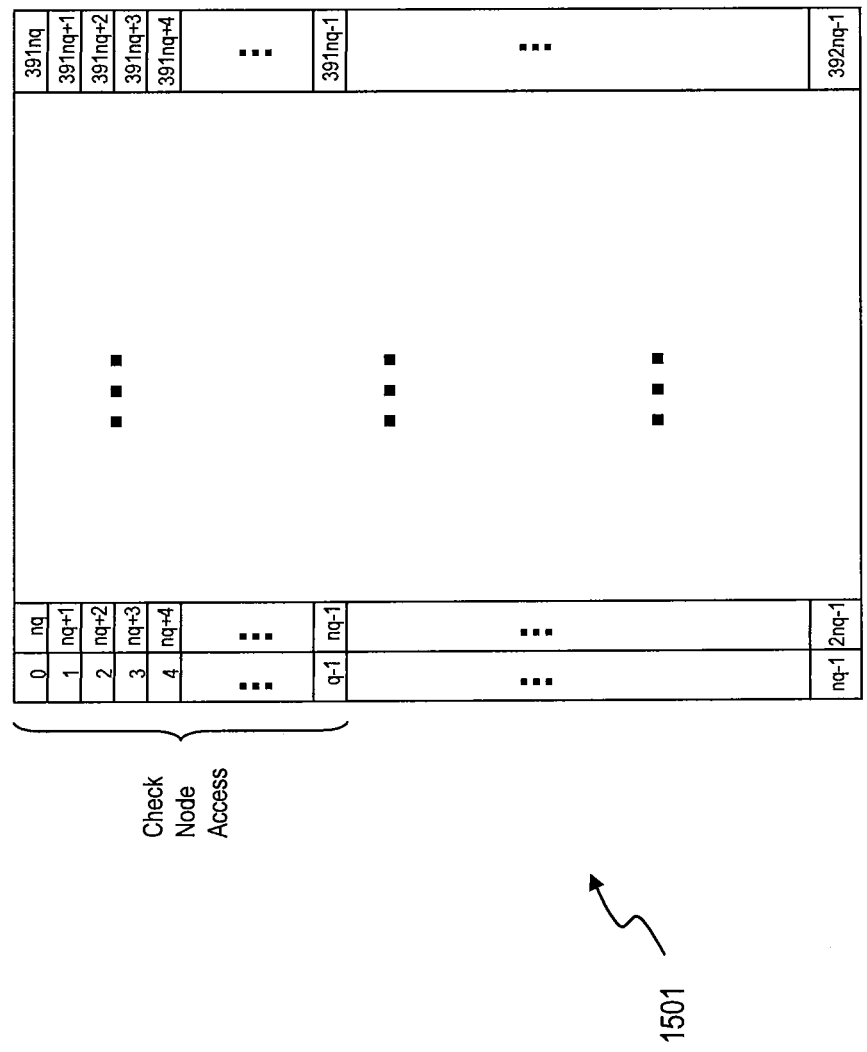
FIGS. 15A and 15B are diagrams of the top edge and bottom edge, respectively, of memory organized to support structured access as to realize randomness in LDPC coding, according to an embodiment of the present invention.
Figure 15B:
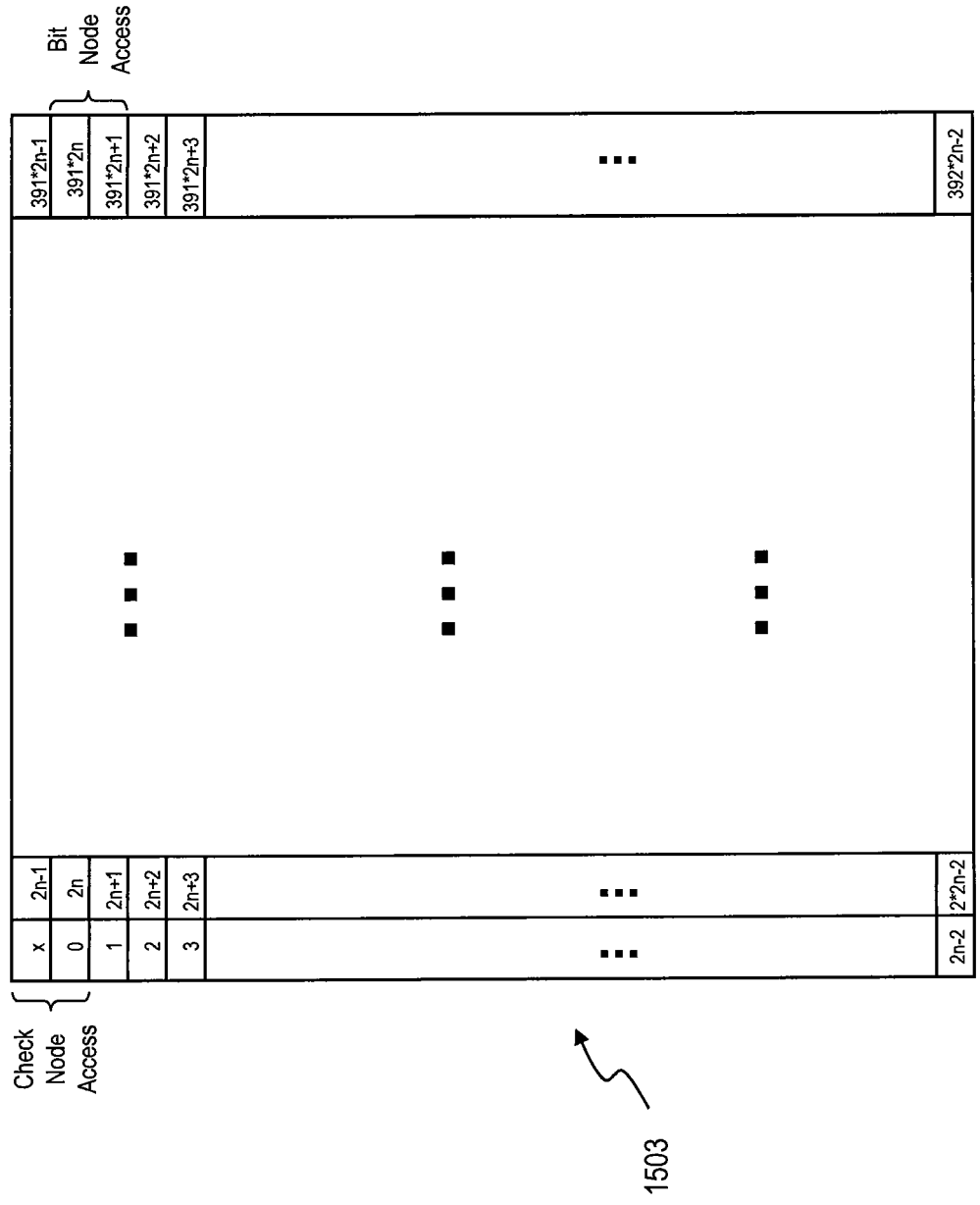

FIGS. 15A and 15B are diagrams of the top edge and bottom edge, respectively, of memory organized to support structured access as to realize randomness in LDPC coding, according to an embodiment of the present invention. Structured access can be achieved without compromising the performance of a truly random code by focusing on the generation of the parity check matrix. In general, a parity check matrix can be specified by the connections of the check nodes with the bit nodes. For example, the bit nodes can be divided into groups of a fixed size, which for illustrative purposes is 392. Additionally, assuming the check nodes connected to the first bit node of degree 3, for instance, are numbered as a, b and c, then the check nodes connected to the second bit node are numbered as a+p, b+p and c+p, the check nodes connected to the third bit node are numbered as a+2p, b+2p and c+2p etc.; where p=(number of check nodes)/392. For the next group of 392 bit nodes, the check nodes connected to the first bit node are different from a, b, c so that with a suitable choice of p, all the check nodes have the same degree. A random search is performed over the free constants such that the resulting LDPC code is cycle-4 and cycle-6 free. Because of the structural characteristics of the parity check matrix of the present invention, the edge information can stored to permit concurrent access to a group of relevant edge values during decoding.

In other words, the approach of the present invention facilitates memory access during check node and bit node processing. The values of the edges in the bipartite graph can be stored in a storage medium, such as random access memory (RAM). It is noted that for a truly random LDPC code during check node and bit node processing, the values of the edges would need to be accessed one by one in a random fashion. However, such a conventional access scheme would be too slow for a high data rate application. The RAM of FIGS. 15A and 15B are organized in a manner, whereby a large group of relevant edges can be fetched in one clock cycle; accordingly, these values are placed "together" in memory, according to a predetermined scheme or arrangement. It is observed that, in actuality, even with a truly random code, for a group of check nodes (and respectively bit nodes), the relevant edges can be placed next to one another in RAM, but then the relevant edges adjacent to a group of bit nodes (respectively check nodes) will be randomly scattered in RAM. Therefore, the "togetherness," under the present invention, stems from the design of the parity check matrices themselves. That is, the check matrix design ensures that the relevant edges for a group of bit nodes and check nodes are simultaneously placed together in RAM.

As seen in FIGS. 15A and 15B, each box contains the value of an edge, which is multiple bits (e.g., 6). Edge RAM, according to one embodiment of the present invention, is divided into two parts: top edge RAM 1501 (FIG. 15A) and bottom edge RAM 1503 (FIG. 15B). Bottom edge RAM contains the edges between bit nodes of degree 2, for example, and check nodes. Top edge RAM contains the edges between bit nodes of degree greater than 2 and check nodes. Therefore, for every check node, 2 adjacent edges are stored in the bottom edge RAM 1503, and the rest of the edges are stored in the top edge RAM 1501. For example, the size of the top edge RAM 1501 and bottom edge RAM 1503 for various code rates are given in Table 1

TABLE 1

|  | 1/2 | 2/3 | 3/4 | 5/6 |
|---|---|---|---|---|
| Top Edge RAM | 400 × 392 | 440 × 392 | 504 × 392 | 520 × 392 |
| Bottom Edge RAM | 160 × 392 | 110 × 392 | 72 × 392 | 52 × 392 |

Based on Table 1, an edge RAM of size 576×392 is sufficient to store the edge metrics for all the code rates of 1/2, 2/3, 3/4, and 5/6.

As noted, under this exemplary scenario, a group of 392 bit nodes and 392 check nodes are selected for processing at a time. For 392 check node processing, $q=d_c-2$ consecutive rows are accessed from the top edge RAM 1501, and 2 consecutive rows from the bottom edge RAM 1503. The value of $d_c$ depends on the specific code, for example $d_c=7$ for rate 1/2, $d_c=10$ for rate 2/3, $d_c=16$ for rate 3/4 and $d_c=22$ for rate 5/6 for the above codes. Of course other values of $d_c$ for other codes are possible. In this instance, q+2 is the degree of each check node.

For bit node processing, if the group of 392 bit nodes has degree 2, their edges are located in 2 consecutive rows of the bottom edge RAM 1503. If the bit nodes have degree d>2, their edges are located in some d rows of the top edge RAM

1501. The address of these d rows can be stored in non-volatile memory, such as Read-Only Memory (ROM). The edges in one of the rows correspond to the first edges of 392 bit nodes, the edges in another row correspond to the second edges of 392 bit nodes, etc. Moreover for each row, the column index of the edge that belongs to the first bit node in the group of 392 can also be stored in ROM. The edges that correspond to the second, third, etc. bit nodes follow the starting column index in a "wrapped around" fashion. For example, if the $j^{th}$ edge in the row belongs to the first bit node, then the (j+1)st edge belongs to the second bit node, (j+2)nd edge belongs to the third bit node, . . . , and (j−1)st edge belongs to the $392^{th}$ bit node.

In Tables 2-5, the row index and the starting column index of top edge RAM 1501 are specified for every group of 392 bit nodes of degree 3 or larger, for the respective code rates of 2/3, 5/6, 1/2, and 3/4. Each row in the Tables 2-5 represents a group of 392 bit nodes. The first number denotes the row index and the second number denotes the starting column index. For example in Table 2, the first row completely determines the addresses of adjacent edges for the first group of 392 bit nodes of degree 13. Specifically, the entry 0/0 indicates that the first adjacent edges for all of the 392 bit nodes are stored in row number 0. Moreover in that row, the column indexed 0 carries the information for the first adjacent edge of the first bit node, column indexed 1 carries the information for the first adjacent edge of the second bit node etc., and finally column indexed 391 carries the information for the first adjacent edge of the 392th bit node.

Similarly the entry 433/323 specifies that the second adjacent edges for all of the 392 bit nodes are stored in row number 433. Moreover in that row, the column indexed 323 carries the information for the second adjacent edge of the first bit node, column indexed 324 carries the information for the second adjacent edge of the second bit node etc. The column indexed 322 carries the information for the second adjacent edge of the 392th bit node.

Similarly, other entries in the first row of Table 2 determine the addresses of the remaining adjacent edges for the first group of 392 bit nodes. Likewise, the entries in the second row of Table 2 determine the addresses of the adjacent edges for the second group of 392 bit nodes, etc.

TABLE 2

Row Index/Starting Column Index (Rate 2/3)

| | | | | | | | | | | | | | |
|---|---|---|---|---|---|---|---|---|---|---|---|---|---|
| 0/0 | 433/323 | 242/150 | 91/117 | 323/112 | 147/93 | 35/105 | 227/232 | 196/311 | 292/180 | 52/244 | 180/250 | 20/335 |
| 8/0 | 121/326 | 178/109 | 299/157 | 195/338 | 99/232 | 251/107 | 411/263 | 364/199 | 28/218 | 276/370 | 108/80 | 84/130 |
| 16/0 | 281/359 | 18/112 | 83/180 | 115/264 | 163/149 | 355/321 | 11/206 | 268/100 | 436/79 | 252/316 | 420/280 | 380/335 |
| 24/0 | 345/122 | 146/365 | 107/40 | 283/363 | 123/368 | 379/340 | 3/156 | 124/15 | 220/187 | 356/127 | 188/71 | 156/82 |
| 32/0 | 425/177 | 234/46 | 267/219 | 67/224 | 171/275 | 219/306 | 387/87 | 372/56 | 140/31 | 36/339 | 116/36 | 316/288 |
| 40/0 | 417/214 | 122/188 | 339/58 | 235/72 | 187/26 | 75/302 | 19/362 | 164/285 | 132/109 | 148/189 | 60/65 | 412/303 |
| 48/0 | 89/312 | 362/214 | 43/21 | 419/219 | 427/378 | 395/10 | 347/167 | 68/221 | 260/310 | 396/54 | 308/268 | 388/176 |
| 56/0 | 73/69 | 434/266 | 155/277 | 435/360 | 363/183 | 51/165 | 331/181 | 12/232 | 404/193 | 172/175 | 324/349 | 348/98 |
| 64/0 | 177/354 | 34/172 | 243/141 | 139/362 | 259/151 | 179/166 | 307/56 | 76/367 | 244/121 | 100/299 | 428/12 | 284/133 |
| 72/0 | 145/264 | 194/335 | 131/362 | 403/326 | 315/180 | 275/137 | 203/86 | 204/303 | 4/5 | 228/360 | 300/76 | 92/17 |
| 80/0 | 377/382 | 394/243 | 27/109 | 59/237 | 371/175 | 211/358 | 291/353 | 340/161 | 212/94 | 332/333 | 44/117 | 236/200 |
| 88/0 | 65/365 | 378/142 | | | | | | | | | | |
| 96/0 | 57/285 | 226/108 | | | | | | | | | | |
| 104/0 | 97/161 | 250/133 | | | | | | | | | | |
| 112/0 | 129/184 | 114/44 | | | | | | | | | | |
| 120/0 | 337/130 | 50/178 | | | | | | | | | | |
| 128/0 | 401/389 | 170/258 | | | | | | | | | | |
| 136/0 | 25/330 | 82/372 | | | | | | | | | | |
| 144/0 | 321/309 | 162/170 | | | | | | | | | | |
| 152/0 | 185/38 | 386/128 | | | | | | | | | | |
| 160/0 | 49/376 | 90/331 | | | | | | | | | | |
| 168/0 | 265/293 | 314/166 | | | | | | | | | | |
| 176/0 | 297/86 | 282/193 | | | | | | | | | | |
| 184/0 | 217/117 | 42/210 | | | | | | | | | | |
| 192/0 | 201/124 | 306/86 | | | | | | | | | | |
| 200/0 | 313/377 | 138/97 | | | | | | | | | | |
| 208/0 | 193/247 | 202/163 | | | | | | | | | | |
| 216/0 | 209/377 | 186/212 | | | | | | | | | | |
| 224/0 | 233/238 | 26/22 | | | | | | | | | | |
| 232/0 | 329/152 | 410/271 | | | | | | | | | | |
| 240/0 | 9/245 | 106/170 | | | | | | | | | | |
| 248/0 | 409/190 | 58/289 | | | | | | | | | | |
| 256/0 | 113/375 | 154/44 | | | | | | | | | | |
| 264/0 | 33/232 | 274/268 | | | | | | | | | | |
| 272/0 | 153/339 | 218/145 | | | | | | | | | | |
| 280/0 | 289/319 | 98/4 | | | | | | | | | | |
| 288/0 | 41/209 | 130/23 | | | | | | | | | | |
| 296/0 | 385/42 | 210/267 | | | | | | | | | | |
| 304/0 | 17/7 | 258/227 | | | | | | | | | | |
| 312/0 | 169/166 | 290/330 | | | | | | | | | | |
| 320/0 | 241/107 | 66/111 | | | | | | | | | | |
| 328/0 | 137/39 | 418/182 | | | | | | | | | | |
| 336/0 | 249/137 | 354/218 | | | | | | | | | | |
| 344/0 | 161/73 | 2/79 | | | | | | | | | | |
| 352/0 | 105/280 | 266/282 | | | | | | | | | | |
| 360/0 | 257/69 | 298/51 | | | | | | | | | | |
| 368/0 | 81/185 | 338/118 | | | | | | | | | | |
| 376/0 | 369/228 | 370/202 | | | | | | | | | | |
| 384/0 | 225/71 | 74/136 | | | | | | | | | | |
| 392/0 | 1/314 | 346/289 | | | | | | | | | | |
| 400/0 | 353/286 | 322/166 | | | | | | | | | | |

TABLE 2-continued

Row Index/Starting Column Index (Rate ⅔)

| | | |
|---|---|---|
| 408/0 | 305/81 | 330/301 |
| 416/0 | 273/170 | 402/282 |
| 424/0 | 393/227 | 10/312 |
| 432/0 | 361/379 | 426/364 |
| 5/0 | 350/140 | 263/166 |
| 13/0 | 102/110 | 87/335 |
| 21/0 | 174/333 | 215/219 |
| 29/0 | 422/227 | 31/273 |
| 37/0 | 406/168 | 175/11 |
| 45/0 | 254/42 | 279/201 |
| 53/0 | 230/347 | 47/291 |
| 61/0 | 214/139 | 55/92 |
| 69/0 | 358/131 | 199/344 |
| 77/0 | 86/374 | 183/298 |
| 85/0 | 118/118 | 407/25 |
| 93/0 | 318/221 | 39/66 |
| 101/0 | 54/256 | 79/202 |
| 109/0 | 374/195 | 119/162 |
| 117/0 | 238/89 | 207/243 |
| 125/0 | 366/78 | 95/96 |
| 133/0 | 46/216 | 351/9 |
| 141/0 | 326/99 | 127/87 |
| 149/0 | 134/75 | 319/102 |
| 157/0 | 158/154 | 15/65 |
| 165/0 | 286/158 | 143/362 |
| 173/0 | 190/146 | 191/205 |
| 181/0 | 62/4 | 343/262 |
| 189/0 | 94/239 | 271/38 |
| 197/0 | 198/207 | 231/297 |
| 205/0 | 22/32 | 167/205 |
| 213/0 | 246/385 | 303/246 |
| 221/0 | 390/368 | 439/220 |
| 229/0 | 334/207 | 247/262 |
| 237/0 | 398/378 | 63/211 |
| 245/0 | 150/340 | 359/100 |
| 253/0 | 294/75 | 415/189 |
| 261/0 | 222/321 | 391/78 |
| 269/0 | 166/343 | 159/105 |
| 277/0 | 126/93 | 239/166 |
| 285/0 | 110/113 | 151/373 |
| 293/0 | 302/144 | 71/18 |
| 301/0 | 262/368 | 111/193 |
| 309/0 | 414/332 | 375/389 |
| 317/0 | 142/256 | 103/242 |
| 325/0 | 278/22 | 7/154 |
| 333/0 | 342/192 | 423/330 |
| 341/0 | 14/181 | 431/16 |
| 349/0 | 38/367 | 383/16 |
| 357/0 | 270/91 | 223/195 |
| 365/0 | 182/211 | 287/313 |
| 373/0 | 310/170 | 135/230 |
| 381/0 | 78/15 | 295/220 |
| 389/0 | 430/353 | 335/91 |
| 397/0 | 30/141 | 367/216 |
| 405/0 | 382/36 | 311/98 |
| 413/0 | 206/377 | 255/372 |
| 421/0 | 438/225 | 399/148 |
| 429/0 | 70/182 | 327/105 |
| 437/0 | 6/277 | 23/94 |

TABLE 3

Row Index/Starting Column Index (Rate ⅚)

| | | | | | | | | | | | | | |
|---|---|---|---|---|---|---|---|---|---|---|---|---|---|
| 0/0 | 221/158 | 442/14 | 503/323 | 283/150 | 104/117 | 384/112 | 165/93 | 45/105 | 266/232 | 226/311 | 347/180 | 67/244 |
| 20/0 | 101/369 | 162/326 | 323/359 | 23/112 | 124/180 | 144/264 | 205/149 | 405/321 | 6/206 | 306/100 | 507/79 | 287/316 |
| 40/0 | 201/285 | 302/12 | 63/134 | 243/68 | 264/238 | 344/375 | 105/259 | 345/213 | 246/75 | 66/148 | 327/100 | 167/220 |
| 60/0 | 381/141 | 422/112 | 443/125 | 223/47 | 204/375 | 504/214 | 145/188 | 385/58 | 206/72 | 166/26 | 87/302 | 7/362 |
| 80/0 | 461/383 | 82/80 | 143/61 | 463/106 | 284/196 | 4/94 | 85/104 | 285/235 | 386/3 | 426/218 | 27/38 | 107/161 |
| 100/0 | 41/310 | 482/66 | 343/376 | 403/166 | 324/265 | 404/236 | 245/230 | 445/63 | 186/343 | 486/88 | 427/202 | 267/362 |
| 120/0 | 61/31 | 502/317 | 123/25 | 163/139 | 424/269 | 164/309 | 25/56 | 505/260 | 406/279 | 346/148 | 367/315 | 47/382 |
| 140/0 | 421/362 | 462/206 | 263/297 | 83/384 | 244/287 | 184/132 | 225/140 | 125/14 | 506/216 | 106/311 | 447/87 | 487/264 |
| 160/0 | 441/191 | 382/360 | 423/282 | 203/2 | 84/58 | 64/347 | 425/249 | 5/267 | 466/232 | 46/275 | 127/385 | 187/26 |
| 180/0 | 501/296 | 222/324 | 3/73 | 43/6 | 364/319 | 444/204 | 185/82 | 65/259 | 26/90 | 286/155 | 307/181 | 147/366 |
| 200/0 | 301/325 | 102/119 | 383/285 | 103/84 | 304/121 | 484/352 | 365/102 | 485/107 | 86/9 | 366/76 | 387/229 | 467/52 |

TABLE 3-continued

Row Index/Starting Column Index (Rate ⅚)

| | | | | | | | | | | | | |
|---|---|---|---|---|---|---|---|---|---|---|---|---|
| 220/0 | 341/331 | 322/242 | 483/275 | 303/293 | 464/166 | 44/283 | 305/232 | 465/86 | 126/193 | 146/184 | 207/38 | 407/117 |
| 240/0 | 21/314 | 362/289 | 363/211 | 183/120 | 24/286 | 224/166 | 325/186 | 265/144 | 446/81 | 326/301 | 227/4 | 247/199 |
| 260/0 | 161/91 | 142/78 | | | | | | | | | | |
| 280/0 | 241/209 | 2/119 | | | | | | | | | | |
| 300/0 | 141/87 | 342/147 | | | | | | | | | | |
| 320/0 | 281/55 | 42/46 | | | | | | | | | | |
| 340/0 | 261/213 | 182/145 | | | | | | | | | | |
| 360/0 | 181/264 | 62/88 | | | | | | | | | | |
| 380/0 | 1/96 | 262/184 | | | | | | | | | | |
| 400/0 | 361/30 | 282/126 | | | | | | | | | | |
| 420/0 | 81/202 | 202/206 | | | | | | | | | | |
| 440/0 | 481/156 | 242/263 | | | | | | | | | | |
| 460/0 | 401/170 | 22/126 | | | | | | | | | | |
| 480/0 | 321/42 | 402/21 | | | | | | | | | | |
| 500/0 | 121/272 | 122/337 | | | | | | | | | | |
| 8/0 | 289/369 | 190/223 | | | | | | | | | | |
| 28/0 | 369/313 | 130/127 | | | | | | | | | | |
| 48/0 | 189/92 | 290/241 | | | | | | | | | | |
| 68/0 | 509/124 | 210/56 | | | | | | | | | | |
| 88/0 | 489/23 | 430/101 | | | | | | | | | | |
| 108/0 | 309/208 | 510/162 | | | | | | | | | | |
| 128/0 | 349/147 | 330/242 | | | | | | | | | | |
| 148/0 | 29/263 | 490/54 | | | | | | | | | | |
| 168/0 | 69/312 | 250/377 | | | | | | | | | | |
| 188/0 | 249/315 | 270/116 | | | | | | | | | | |
| 208/0 | 49/176 | 170/58 | | | | | | | | | | |
| 228/0 | 109/337 | 10/55 | | | | | | | | | | |
| 248/0 | 469/65 | 110/187 | | | | | | | | | | |
| 268/0 | 209/105 | 470/362 | | | | | | | | | | |
| 288/0 | 229/164 | 150/80 | | | | | | | | | | |
| 308/0 | 9/293 | 410/374 | | | | | | | | | | |
| 328/0 | 329/122 | 310/152 | | | | | | | | | | |
| 348/0 | 149/124 | 390/382 | | | | | | | | | | |
| 368/0 | 389/160 | 230/92 | | | | | | | | | | |
| 388/0 | 169/357 | 370/368 | | | | | | | | | | |
| 408/0 | 449/296 | 90/377 | | | | | | | | | | |
| 428/0 | 269/32 | 70/212 | | | | | | | | | | |
| 448/0 | 409/59 | 450/257 | | | | | | | | | | |
| 468/0 | 89/291 | 30/234 | | | | | | | | | | |
| 488/0 | 429/130 | 350/95 | | | | | | | | | | |
| 508/0 | 129/276 | 50/38 | | | | | | | | | | |
| 11/0 | 292/349 | 133/372 | | | | | | | | | | |
| 31/0 | 492/271 | 253/248 | | | | | | | | | | |
| 51/0 | 192/149 | 273/378 | | | | | | | | | | |
| 71/0 | 352/265 | 153/37 | | | | | | | | | | |
| 91/0 | 332/244 | 293/199 | | | | | | | | | | |
| 111/0 | 152/354 | 393/243 | | | | | | | | | | |
| 131/0 | 312/144 | 213/184 | | | | | | | | | | |
| 151/0 | 92/219 | 173/11 | | | | | | | | | | |
| 171/0 | 392/182 | 473/325 | | | | | | | | | | |
| 191/0 | 232/219 | 193/30 | | | | | | | | | | |
| 211/0 | 372/157 | 13/63 | | | | | | | | | | |
| 231/0 | 12/108 | 333/359 | | | | | | | | | | |
| 251/0 | 112/33 | 513/88 | | | | | | | | | | |
| 271/0 | 72/207 | 413/9 | | | | | | | | | | |
| 291/0 | 272/100 | 93/357 | | | | | | | | | | |
| 311/0 | 432/166 | 233/272 | | | | | | | | | | |
| 331/0 | 412/265 | 33/210 | | | | | | | | | | |
| 351/0 | 132/155 | 493/50 | | | | | | | | | | |
| 371/0 | 512/292 | 453/214 | | | | | | | | | | |
| 391/0 | 172/387 | 53/114 | | | | | | | | | | |
| 411/0 | 32/233 | 433/177 | | | | | | | | | | |
| 431/0 | 252/113 | 373/52 | | | | | | | | | | |
| 451/0 | 212/347 | 353/90 | | | | | | | | | | |
| 471/0 | 52/89 | 73/198 | | | | | | | | | | |
| 491/0 | 452/285 | 313/233 | | | | | | | | | | |
| 511/0 | 472/103 | 113/84 | | | | | | | | | | |
| 14/0 | 55/43 | 36/361 | | | | | | | | | | |
| 34/0 | 355/70 | 116/287 | | | | | | | | | | |
| 54/0 | 115/137 | 196/57 | | | | | | | | | | |
| 74/0 | 95/161 | 416/206 | | | | | | | | | | |
| 94/0 | 295/273 | 336/209 | | | | | | | | | | |
| 114/0 | 255/184 | 296/287 | | | | | | | | | | |
| 134/0 | 435/11 | 376/38 | | | | | | | | | | |
| 154/0 | 155/356 | 16/379 | | | | | | | | | | |
| 174/0 | 135/251 | 76/10 | | | | | | | | | | |
| 194/0 | 235/314 | 256/293 | | | | | | | | | | |
| 214/0 | 75/296 | 216/326 | | | | | | | | | | |

TABLE 3-continued

Row Index/Starting Column Index (Rate 5/6)

| | | |
|---|---|---|
| 234/0 | 275/314 | 356/116 |
| 254/0 | 455/133 | 156/165 |
| 274/0 | 375/292 | 436/283 |
| 294/0 | 515/227 | 456/337 |
| 314/0 | 315/111 | 176/155 |
| 334/0 | 175/98 | 276/334 |
| 354/0 | 335/7 | 476/87 |
| 374/0 | 415/161 | 136/15 |
| 394/0 | 395/338 | 496/98 |
| 414/0 | 495/82 | 396/269 |
| 434/0 | 195/312 | 516/187 |
| 454/0 | 475/100 | 56/356 |
| 474/0 | 15/163 | 316/195 |
| 494/0 | 35/197 | 96/145 |
| 514/0 | 215/301 | 236/381 |
| 17/0 | 18/321 | 459/4 |
| 37/0 | 398/236 | 139/8 |
| 57/0 | 338/117 | 439/84 |
| 77/0 | 438/97 | 499/93 |
| 97/0 | 298/292 | 19/215 |
| 117/0 | 218/224 | 419/275 |
| 137/0 | 98/229 | 299/27 |
| 157/0 | 378/133 | 339/232 |
| 177/0 | 118/191 | 359/271 |
| 197/0 | 478/272 | 159/386 |
| 217/0 | 498/262 | 119/219 |
| 237/0 | 418/282 | 519/297 |
| 257/0 | 238/33 | 379/339 |
| 277/0 | 258/230 | 179/350 |
| 297/0 | 158/27 | 59/188 |
| 317/0 | 518/249 | 399/229 |
| 337/0 | 278/333 | 279/330 |
| 357/0 | 138/276 | 239/49 |
| 377/0 | 178/34 | 219/304 |
| 397/0 | 458/344 | 199/181 |
| 417/0 | 58/312 | 479/158 |
| 437/0 | 358/377 | 259/364 |
| 457/0 | 78/157 | 319/380 |
| 477/0 | 318/75 | 99/57 |
| 497/0 | 38/296 | 79/26 |
| 517/0 | 198/115 | 39/342 |

TABLE 4

Row Index/Starting Column Index (Rate 1/2)

| | | | | | | | | |
|---|---|---|---|---|---|---|---|---|
| 240/0 | 306/249 | 387/194 | 98/132 | 268/80 | 219/33 | 64/252 | 108/54 | |
| 245/0 | 146/169 | 37/233 | 183/243 | 233/207 | 9/336 | 54/91 | 363/391 | |
| 250/0 | 196/123 | 242/31 | 63/103 | 118/277 | 344/177 | 339/46 | 173/219 | |
| 255/0 | 216/36 | 287/288 | 318/43 | 83/327 | 34/28 | 354/114 | 53/84 | |
| 260/0 | 316/69 | 377/8 | 323/110 | 308/250 | 314/209 | 214/101 | 298/134 | |
| 265/0 | 256/186 | 257/166 | 23/196 | 68/68 | 234/41 | 144/249 | 333/11 | |
| 270/0 | 201/192 | 32/38 | 213/255 | 203/124 | 84/285 | 264/12 | 263/134 | |
| 275/0 | 36/100 | 247/220 | 388/286 | 273/339 | 89/334 | 154/192 | 223/148 | |
| 280/0 | 396/141 | 132/112 | 283/125 | 163/47 | 79/375 | 14/214 | 138/188 | |
| 285/0 | 31/189 | 82/65 | 18/303 | 313/92 | 299/317 | 129/18 | 373/356 | |
| 290/0 | 381/332 | 332/312 | 258/214 | 43/21 | 364/219 | 274/378 | 198/10 | |
| 295/0 | 121/66 | 217/124 | 338/346 | 48/380 | 189/155 | 199/79 | 278/224 | |
| 300/0 | 71/260 | 22/248 | 193/240 | 288/248 | 284/237 | 224/268 | 38/263 | |
| 305/0 | 46/232 | 282/193 | 293/175 | 378/349 | 169/98 | 184/165 | 168/31 | |
| 310/0 | 156/116 | 87/62 | 208/390 | 113/287 | 69/354 | 269/172 | 343/141 | |
| 315/0 | 311/12 | 192/133 | 143/43 | 58/75 | 124/176 | 324/24 | 383/346 | |
| 320/0 | 16/118 | 372/259 | 368/265 | 133/59 | 309/321 | 289/272 | 104/80 | |
| 325/0 | 336/114 | 7/90 | 123/190 | 228/181 | 114/324 | 319/240 | 244/246 | |
| 330/0 | 226/71 | 112/218 | 358/348 | 398/83 | 179/121 | 119/366 | 394/197 | |
| 335/0 | 21/383 | 142/80 | 158/61 | 218/106 | 329/196 | 4/94 | 49/104 | |
| 340/0 | 221/97 | 2/252 | 178/174 | 13/190 | 164/166 | 99/130 | 204/9 | |
| 345/0 | 126/76 | 67/120 | 78/183 | 243/53 | 134/140 | 149/197 | 359/239 | |
| 350/0 | 96/221 | 392/290 | 28/163 | 353/297 | 279/147 | 294/343 | 374/314 | |
| 355/0 | 176/230 | 367/63 | 73/343 | 393/88 | 174/202 | 259/362 | 249/256 | |
| 360/0 | 241/60 | 202/21 | 348/66 | 328/351 | 139/144 | 94/258 | 384/41 | |
| 365/0 | 26/374 | 262/54 | 303/391 | 153/132 | 254/145 | 209/307 | 74/126 | |
| 370/0 | 91/25 | 382/139 | 238/269 | 128/309 | 239/56 | 24/260 | 369/279 | |
| 375/0 | 151/213 | 317/133 | 253/161 | 188/92 | 399/371 | 194/116 | 39/302 | |
| 380/0 | 296/140 | 307/14 | 93/216 | 148/311 | 389/87 | 334/264 | 109/335 | |
| 385/0 | 286/76 | 222/17 | 33/116 | 8/191 | 304/360 | 19/282 | 379/2 | |
| 390/0 | 106/217 | 212/188 | 103/68 | 248/264 | 29/48 | 44/174 | 349/274 | |
| 395/0 | 281/269 | 162/333 | 3/243 | 88/320 | 159/75 | 59/300 | 229/136 | |
| 0/0 | 346/176 | 157/302 | | | | | | |
| 5/0 | 171/47 | 42/1 | | | | | | |
| 10/0 | 86/124 | 267/2 | | | | | | |
| 15/0 | 321/291 | 197/8 | | | | | | |
| 20/0 | 236/149 | 147/50 | | | | | | |
| 25/0 | 1/168 | 347/191 | | | | | | |
| 30/0 | 386/257 | 252/12 | | | | | | |
| 35/0 | 301/64 | 397/176 | | | | | | |
| 40/0 | 341/340 | 272/97 | | | | | | |
| 45/0 | 101/201 | 122/134 | | | | | | |
| 50/0 | 136/201 | 57/343 | | | | | | |
| 55/0 | 131/169 | 292/299 | | | | | | |
| 60/0 | 166/389 | 352/216 | | | | | | |
| 65/0 | 76/132 | 297/33 | | | | | | |
| 70/0 | 211/261 | 167/45 | | | | | | |
| 75/0 | 161/323 | 12/150 | | | | | | |
| 80/0 | 116/93 | 107/105 | | | | | | |
| 85/0 | 246/180 | 322/244 | | | | | | |
| 90/0 | 261/190 | 342/297 | | | | | | |
| 95/0 | 366/385 | 177/103 | | | | | | |
| 100/0 | 391/240 | 77/328 | | | | | | |
| 105/0 | 266/327 | 182/182 | | | | | | |
| 110/0 | 181/73 | 47/322 | | | | | | |
| 115/0 | 191/126 | 72/135 | | | | | | |
| 120/0 | 251/115 | 227/161 | | | | | | |
| 125/0 | 276/85 | 172/213 | | | | | | |

TABLE 4-continued

Row Index/Starting Column Index (Rate ½)

| | | |
|---|---|---|
| 130/0 | 371/17 | 327/236 |
| 135/0 | 66/326 | 62/109 |
| 140/0 | 141/232 | 357/107 |
| 145/0 | 271/218 | 207/370 |
| 150/0 | 56/252 | 127/20 |
| 155/0 | 61/143 | 97/305 |
| 160/0 | 11/383 | 237/214 |
| 165/0 | 376/359 | 337/112 |
| 170/0 | 186/149 | 277/321 |
| 175/0 | 206/79 | 92/316 |
| 180/0 | 291/315 | 362/135 |
| 185/0 | 51/93 | 232/326 |
| 190/0 | 6/197 | 102/103 |
| 195/0 | 331/142 | 187/122 |
| 200/0 | 361/363 | 27/368 |
| 205/0 | 326/15 | 152/187 |
| 210/0 | 111/82 | 52/214 |
| 215/0 | 41/385 | 312/150 |
| 220/0 | 356/387 | 137/254 |
| 225/0 | 81/175 | 302/84 |
| 230/0 | 351/11 | 17/303 |
| 235/0 | 231/55 | 117/265 |

TABLE 5

Row Index/Starting Column Index (Rate ¾)

| | | | | | | | | | | | | | |
|---|---|---|---|---|---|---|---|---|---|---|---|---|---|
| 0/0 | 113/334 | 100/308 | 423/175 | 493/163 | 32/370 | 116/20 | 467/48 | 243/275 | 370/284 | 356/114 | 77/201 | 7/214 |
| 14/0 | 29/350 | 44/366 | 185/335 | 3/40 | 494/155 | 144/324 | 383/185 | 229/96 | 230/376 | 188/182 | 427/304 | 385/269 |
| 28/0 | 435/215 | 366/165 | 101/329 | 17/221 | 46/276 | 74/130 | 341/4 | 313/169 | 314/11 | 272/267 | 21/376 | 273/122 |
| 42/0 | 155/306 | 240/253 | 353/325 | 451/355 | 312/33 | 88/27 | 47/23 | 327/90 | 286/87 | 34/201 | 483/221 | 175/39 |
| 56/0 | 197/263 | 492/185 | 283/223 | 367/316 | 60/241 | 228/91 | 145/175 | 439/3 | 454/168 | 202/98 | 133/214 | 203/82 |
| 70/0 | 463/384 | 352/298 | 269/9 | 129/294 | 256/303 | 214/387 | 5/316 | 285/257 | 90/282 | 48/376 | 399/317 | 329/102 |
| 84/0 | 1/159 | 170/317 | 409/245 | 255/173 | 270/11 | 438/179 | 271/224 | 89/131 | 300/144 | 328/199 | 343/321 | 231/338 |
| 98/0 | 211/266 | 450/256 | 199/279 | 171/358 | 242/192 | 466/378 | 187/100 | 19/70 | 62/98 | 384/313 | 35/382 | 245/164 |
| 112/0 | 141/386 | 128/357 | 87/172 | 465/64 | 424/35 | 354/238 | 117/300 | 257/174 | 146/154 | 496/182 | 161/232 | 91/355 |
| 126/0 | 15/196 | 296/183 | 395/218 | 73/356 | 452/367 | 158/342 | 173/70 | 131/251 | 258/268 | 76/176 | 455/172 | 119/109 |
| 140/0 | 57/265 | 58/45 | 437/175 | 59/369 | 284/357 | 102/53 | 103/286 | 33/318 | 412/49 | 160/25 | 105/120 | 371/188 |
| 154/0 | 323/272 | 198/11 | 31/140 | 227/330 | 410/150 | 298/113 | 61/249 | 495/207 | 244/190 | 426/233 | 63/30 | 189/283 |
| 168/0 | 477/41 | 408/85 | 311/63 | 45/301 | 326/13 | 200/292 | 159/218 | 481/99 | 20/171 | 174/192 | 217/102 | 315/178 |
| 182/0 | 43/340 | 212/289 | 381/152 | 115/273 | 172/111 | 368/2 | 75/34 | 369/291 | 132/92 | 482/375 | 413/195 | 301/219 |
| 196/0 | 225/338 | 436/232 | 479/161 | 339/50 | 340/372 | 396/293 | 355/218 | 397/80 | 468/212 | 342/375 | 497/351 | 259/314 |
| 210/0 | 253/84 | 30/254 | 297/89 | 241/165 | 382/65 | 18/60 | 299/186 | 425/104 | 440/255 | 398/62 | 441/191 | 469/14 |
| 224/0 | 449/109 | 478/333 | 325/82 | 143/94 | 186/39 | 130/44 | 453/22 | 411/329 | 6/168 | 118/357 | 287/119 | 357/258 |
| 238/0 | 169/152 | 310/308 | 213/159 | 157/365 | 480/361 | 4/64 | 201/245 | 215/92 | 104/185 | 216/189 | 147/125 | 49/310 |
| 252/0 | 267/180 | 380/44 | | | | | | | | | | |
| 266/0 | 71/132 | 184/228 | | | | | | | | | | |
| 280/0 | 281/48 | 268/91 | | | | | | | | | | |
| 294/0 | 393/59 | 254/241 | | | | | | | | | | |
| 308/0 | 379/129 | 86/21 | | | | | | | | | | |
| 322/0 | 127/319 | 114/57 | | | | | | | | | | |
| 336/0 | 85/227 | 282/298 | | | | | | | | | | |
| 350/0 | 491/101 | 324/74 | | | | | | | | | | |
| 364/0 | 309/378 | 226/317 | | | | | | | | | | |
| 378/0 | 239/220 | 2/201 | | | | | | | | | | |
| 392/0 | 407/135 | 156/221 | | | | | | | | | | |
| 406/0 | 365/360 | 394/114 | | | | | | | | | | |
| 420/0 | 183/335 | 422/129 | | | | | | | | | | |
| 434/0 | 421/105 | 464/120 | | | | | | | | | | |
| 448/0 | 295/245 | 142/160 | | | | | | | | | | |
| 462/0 | 351/37 | 338/29 | | | | | | | | | | |
| 476/0 | 337/16 | 72/305 | | | | | | | | | | |
| 490/0 | 99/220 | 16/347 | | | | | | | | | | |
| 8/0 | 23/384 | 346/305 | | | | | | | | | | |
| 22/0 | 415/118 | 444/373 | | | | | | | | | | |
| 36/0 | 65/28 | 24/211 | | | | | | | | | | |
| 50/0 | 261/130 | 80/113 | | | | | | | | | | |
| 64/0 | 275/316 | 220/366 | | | | | | | | | | |
| 78/0 | 205/109 | 206/255 | | | | | | | | | | |
| 92/0 | 51/110 | 38/74 | | | | | | | | | | |
| 106/0 | 373/262 | 304/363 | | | | | | | | | | |
| 120/0 | 345/250 | 472/134 | | | | | | | | | | |
| 134/0 | 37/173 | 388/301 | | | | | | | | | | |
| 148/0 | 359/272 | 430/234 | | | | | | | | | | |
| 162/0 | 429/71 | 150/189 | | | | | | | | | | |
| 176/0 | 93/332 | 94/299 | | | | | | | | | | |
| 190/0 | 163/385 | 416/307 | | | | | | | | | | |
| 204/0 | 289/144 | 164/50 | | | | | | | | | | |
| 218/0 | 457/140 | 290/145 | | | | | | | | | | |
| 232/0 | 79/42 | 360/26 | | | | | | | | | | |
| 246/0 | 387/59 | 262/196 | | | | | | | | | | |
| 260/0 | 233/93 | 66/21 | | | | | | | | | | |
| 274/0 | 303/116 | 136/28 | | | | | | | | | | |
| 288/0 | 121/176 | 276/279 | | | | | | | | | | |
| 302/0 | 485/235 | 332/69 | | | | | | | | | | |
| 316/0 | 443/336 | 178/353 | | | | | | | | | | |

TABLE 5-continued

Row Index/Starting Column Index (Rate ¾)

| | | |
|---|---|---|
| 330/0 | 499/298 | 458/45 |
| 344/0 | 191/240 | 234/244 |
| 358/0 | 9/13 | 248/94 |
| 372/0 | 219/36 | 402/112 |
| 386/0 | 331/192 | 52/58 |
| 400/0 | 471/294 | 500/144 |
| 414/0 | 317/186 | 318/150 |
| 428/0 | 107/69 | 108/346 |
| 442/0 | 149/139 | 486/346 |
| 456/0 | 135/170 | 192/65 |
| 470/0 | 401/2 | 10/281 |
| 484/0 | 177/326 | 374/2 |
| 498/0 | 247/143 | 122/242 |
| 11/0 | 474/49 | 433/281 |
| 25/0 | 292/134 | 335/294 |
| 39/0 | 404/29 | 265/296 |
| 53/0 | 320/345 | 111/194 |
| 67/0 | 208/221 | 13/84 |
| 81/0 | 264/133 | 419/95 |
| 95/0 | 54/157 | 83/51 |
| 109/0 | 166/363 | 195/303 |
| 123/0 | 194/389 | 377/15 |
| 137/0 | 460/36 | 447/169 |
| 151/0 | 306/23 | 279/311 |
| 165/0 | 40/133 | 153/233 |
| 179/0 | 236/53 | 27/257 |
| 193/0 | 446/121 | 293/259 |
| 207/0 | 250/350 | 167/310 |
| 221/0 | 68/104 | 209/119 |
| 235/0 | 334/224 | 251/323 |
| 249/0 | 432/83 | 503/117 |
| 263/0 | 180/192 | 125/201 |
| 277/0 | 362/183 | 391/267 |
| 291/0 | 110/347 | 405/288 |
| 305/0 | 222/22 | 223/10 |
| 319/0 | 502/80 | 489/249 |
| 333/0 | 12/100 | 139/370 |
| 347/0 | 390/229 | 321/44 |
| 361/0 | 376/295 | 97/70 |
| 375/0 | 124/166 | 69/108 |
| 389/0 | 418/73 | 349/223 |
| 403/0 | 96/321 | 237/242 |
| 417/0 | 26/23 | 181/237 |
| 431/0 | 82/7 | 55/264 |
| 445/0 | 348/347 | 461/381 |
| 459/0 | 138/244 | 41/239 |
| 473/0 | 488/356 | 475/320 |
| 487/0 | 278/80 | 307/248 |
| 501/0 | 152/153 | 363/334 |

With the organization shown in FIGS. 15A and 15B, speed of memory access is greatly enhanced during LDPC coding.

Figure 16:
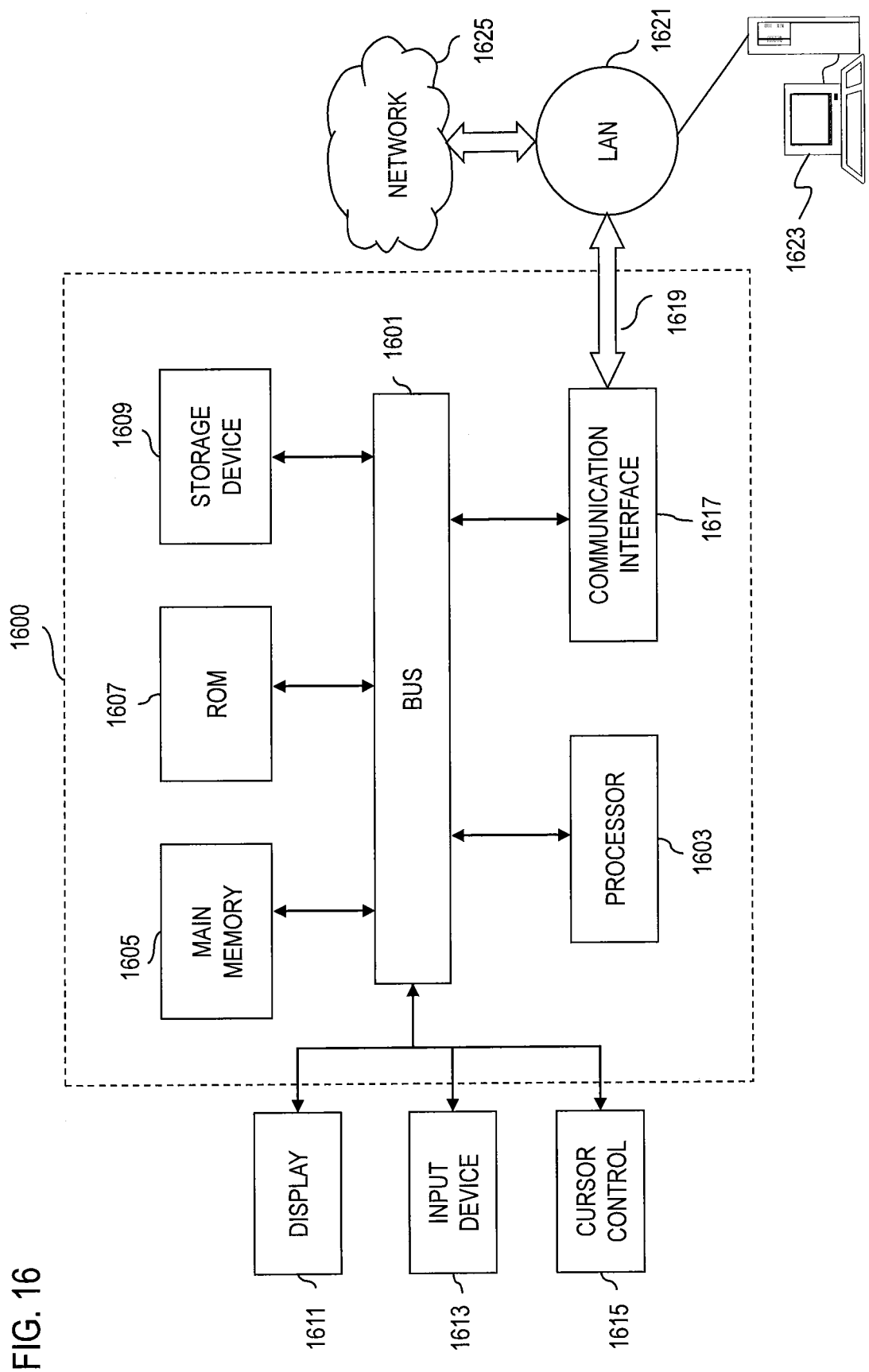
FIG. 16 is a diagram of a computer system that can perform the processes of encoding and decoding of LDPC codes, in accordance with embodiments of the present invention.

FIG. 16 illustrates a computer system upon which an embodiment according to the present invention can be implemented. The computer system 1600 includes a bus 1601 or other communication mechanism for communicating information, and a processor 1603 coupled to the bus 1601 for processing information. The computer system 1600 also includes main memory 1605, such as a random access memory (RAM) or other dynamic storage device, coupled to the bus 1601 for storing information and instructions to be executed by the processor 1603. Main memory 1605 can also be used for storing temporary variables or other intermediate information during execution of instructions to be executed by the processor 1603. The computer system 1600 further includes a read only memory (ROM) 1607 or other static storage device coupled to the bus 1601 for storing static information and instructions for the processor 1603. A storage device 1609, such as a magnetic disk or optical disk, is additionally coupled to the bus 1601 for storing information and instructions.

The computer system 1600 may be coupled via the bus 1601 to a display 1611, such as a cathode ray tube (CRT), liquid crystal display, active matrix display, or plasma display, for displaying information to a computer user. An input device 1613, such as a keyboard including alphanumeric and other keys, is coupled to the bus 1601 for communicating information and command selections to the processor 1603. Another type of user input device is cursor control 1615, such as a mouse, a trackball, or cursor direction keys for communicating direction information and command selections to the processor 1603 and for controlling cursor movement on the display 1611.

According to one embodiment of the invention, generation of LDPC codes is provided by the computer system 1600 in response to the processor 1603 executing an arrangement of instructions contained in main memory 1605. Such instructions can be read into main memory 1605 from another computer-readable medium, such as the storage device 1609. Execution of the arrangement of instructions contained in main memory 1605 causes the processor 1603 to perform the process steps described herein. One or more processors in a multi-processing arrangement may also be employed to execute the instructions contained in main memory 1605. In alternative embodiments, hard-wired circuitry may be used in place of or in combination with software instructions to implement the embodiment of the present invention. Thus, embodiments of the present invention are not limited to any specific combination of hardware circuitry and software.

The computer system 1600 also includes a communication interface 1617 coupled to bus 1601. The communication interface 1617 provides a two-way data communication coupling to a network link 1619 connected to a local network 1621. For example, the communication interface 1617 may be a digital subscriber line (DSL) card or modem, an integrated services digital network (ISDN) card, a cable modem, or a telephone modem to provide a data communication connection to a corresponding type of telephone line. As another example, communication interface 1617 may be a local area network (LAN) card (e.g. for Ethernet™ or an Asynchronous Transfer Model (ATM) network) to provide a data communication connection to a compatible LAN. Wireless links can also be implemented. In any such implementation, communication interface 1617 sends and receives electrical, electromagnetic, or optical signals that carry digital data streams representing various types of information. Further, the communication interface 1617 can include peripheral interface devices, such as a Universal Serial Bus (USB) interface, a PCMCIA (Personal Computer Memory Card International Association) interface, etc.

The network link 1619 typically provides data communication through one or more networks to other data devices. For example, the network link 1619 may provide a connection through local network 1621 to a host computer 1623, which has connectivity to a network 1625 (e.g. a wide area network (WAN) or the global packet data communication network now commonly referred to as the "Internet") or to data equipment operated by service provider. The local network 1621 and network 1625 both use electrical, electromagnetic, or optical signals to convey information and instructions. The signals through the various networks and the signals on network link 1619 and through communication interface 1617, which communicate digital data with computer system 1600, are exemplary forms of carrier waves bearing the information and instructions.

The computer system 1600 can send messages and receive data, including program code, through the network(s), network link 1619, and communication interface 1617. In the Internet example, a server (not shown) might transmit requested code belonging to an application program for implementing an embodiment of the present invention through the network 1625, local network 1621 and communication interface 1617. The processor 1603 may execute the transmitted code while being received and/or store the code in storage device 169, or other non-volatile storage for later execution. In this manner, computer system 1600 may obtain application code in the form of a carrier wave.

The term "computer-readable medium" as used herein refers to any medium that participates in providing instructions to the processor 1603 for execution. Such a medium may take many forms, including but not limited to non-volatile media, volatile media, and transmission media. Non-volatile media include, for example, optical or magnetic disks, such as storage device 1609. Volatile media include dynamic memory, such as main memory 1605. Transmission media include coaxial cables, copper wire and fiber optics, including the wires that comprise bus 1601. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Accordingly, the various embodiments of the present invention provide an approach for generating structured Low Density Parity Check (LDPC) codes, as to simplify the encoder and decoder. Structure of the LDPC codes is provided by restricting the parity check matrix to be lower triangular. Also, the approach can advantageously exploit the unequal error protecting capability of LDPC codes on transmitted bits to provide extra error protection to more vulnerable bits of high order modulation constellations (such as 8-PSK (Phase Shift Keying)). The decoding process involves iteratively regenerating signal constellation bit metrics into an LDPC decoder after each decoder iteration or several decoder iterations. The above approach advantageously yields reduced complexity without sacrificing performance.

While the present invention has been described in connection with a number of embodiments and implementations, the present invention is not so limited but covers various obvious modifications and equivalent arrangements, which fall within the purview of the appended claims.

What is claimed is:

1. A method comprising:
    encoding an information signal according to a low density parity check (LDPC) code, wherein the LDPC code has a parity check matrix with a structure that enables group retrieval of edge values for a subset of bit nodes of the LDPC code or a subset of check nodes of the LDPC code in a partially parallel decoding process;
    generating a radio communications signal including the encoded information signal; and
    transmitting the radio communications signal.

2. The method of claim 1, further comprising:
    receiving the transmitted radio communications signal; and
    decoding the received radio communications signal using the partially parallel decoding process to recover the information signal.

3. An apparatus comprising:
    an encoder configured to encode an information signal according to a low density parity check (LDPC) code, wherein the LDPC code has a parity check matrix with a structure that enables group retrieval of edge values for a subset of bit nodes of the LDPC code or a subset of check nodes of the LDPC code in a partially parallel decoding process; and
a transmitter configured to generate and transmit a radio communications signal including the encoded information signal.

* * * * *